(12) United States Patent
Oguro et al.

(10) Patent No.: US 8,592,134 B2
(45) Date of Patent: Nov. 26, 2013

(54) COMPOSITION FOR FORMING BASE FILM FOR LITHOGRAPHY AND METHOD FOR FORMING MULTILAYER RESIST PATTERN

(75) Inventors: Dai Oguro, Hiratsuka (JP); Go Higashihara, Hiratsuka (JP); Seiji Kita, Kurashiki (JP); Mitsuharu Kitamura, Kurashiki (JP); Masashi Ogiwara, Kurashiki (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 235 days.

(21) Appl. No.: 12/746,421

(22) PCT Filed: Dec. 1, 2008

(86) PCT No.: PCT/JP2008/071798
§ 371 (c)(1),
(2), (4) Date: Aug. 30, 2010

(87) PCT Pub. No.: WO2009/072465
PCT Pub. Date: Jun. 11, 2009

(65) Prior Publication Data
US 2010/0316950 A1 Dec. 16, 2010

(30) Foreign Application Priority Data

Dec. 7, 2007 (JP) .................. 2007-317102
Dec. 10, 2007 (JP) .................. 2007-318874
Dec. 26, 2007 (JP) .................. 2007-334057

(51) Int. Cl.
G03F 7/00 (2006.01)
G03F 7/11 (2006.01)
G03F 7/32 (2006.01)
C08F 283/00 (2006.01)

(52) U.S. Cl.
USPC ............. 430/271.1; 430/270.1; 524/593; 524/611; 525/480; 525/534

(58) Field of Classification Search
USPC ................ 525/72; 430/270.1, 271.1
See application file for complete search history.

(56) References Cited

U.S. PATENT DOCUMENTS

| | | | |
|---|---|---|---|
| 2,597,159 A | 5/1952 | May et al. | |
| 3,178,393 A | 4/1965 | Brandt et al. | |
| 3,453,220 A | 7/1969 | Vanderwerff | |
| 4,110,279 A * | 8/1978 | Nelson et al. | 528/501 |
| 4,214,872 A * | 7/1980 | Uhrig et al. | 8/589 |
| 4,395,498 A * | 7/1983 | Benham | 523/158 |
| 4,748,278 A * | 5/1988 | Rohrscheid | 568/438 |
| 6,713,591 B1 * | 3/2004 | Senzaki et al. | 528/129 |
| 6,852,791 B2 * | 2/2005 | Kawaguchi et al. | 524/553 |
| 7,819,938 B2 * | 10/2010 | Keller et al. | 75/252 |
| 7,871,781 B2 * | 1/2011 | Rundstrom et al. | 435/7.1 |
| 7,919,223 B2 * | 4/2011 | Echigo et al. | 430/270.1 |
| 8,030,431 B2 * | 10/2011 | Daum et al. | 528/121 |
| 2004/0266976 A1 | 12/2004 | Senzaki et al. | |
| 2007/0232839 A1 * | 10/2007 | Yoshitomo et al. | 568/720 |
| 2010/0115084 A1 * | 5/2010 | Caspi et al. | 709/224 |
| 2010/0151381 A1 * | 6/2010 | Tachibana et al. | 430/270.1 |
| 2011/0009574 A1 * | 1/2011 | Kita et al. | 525/472 |

FOREIGN PATENT DOCUMENTS

| | | |
|---|---|---|
| EP | 1 995 636 A1 | 11/2008 |
| JP | 63-97614 | 4/1988 |
| JP | 63-97615 | 4/1988 |
| JP | 2000 143937 | 5/2000 |
| JP | 2001 040293 | 2/2001 |
| JP | 2002 14474 | 1/2002 |
| JP | 2002 214777 | 7/2002 |
| JP | 2003-155259 | 5/2003 |
| JP | 2004-91550 | 3/2004 |
| JP | 2005 156816 | 6/2005 |
| JP | 2006 53543 | 2/2006 |
| JP | 2007 017867 | 1/2007 |
| JP | 2009091537 * | 4/2009 |
| JP | 2009173623 * | 8/2009 |
| JP | 2011227492 * | 11/2011 |
| WO | WO 2007091621 A1 * | 8/2007 |
| WO | WO2007097457 A1 * | 8/2007 |
| WO | 2007 105776 | 9/2007 |

OTHER PUBLICATIONS

Extended European Search Report issued Feb. 13, 2012, in Patent Application No. 08857409.0.
Tadamasa Nemoto, et al., "Synthesis and Properties of Organosoluble Poly(phenylenemethylene)s from Substituted Benzenes or Naphthalenes", Polymer Journal, The Society of Polymer Science, vol. 38, No. 12, XP 8133698, (2006), pp. 1278-1282.
U.S. Appl. No. 12/746,611, filed Jun. 7, 2010, Kita, et al.

* cited by examiner

*Primary Examiner* — Amanda C. Walke
(74) *Attorney, Agent, or Firm* — Oblon, Spivak, McClelland, Maier & Neustadt, L.L.P.

(57) ABSTRACT

A composition for forming an underlayer film for lithography for imparting excellent optical characteristics and etching resistance to an underlayer film for lithography, an underlayer film being formed of the composition and having a high refractive index (n) and a low extinction coefficient (k), being transparent, having high etching resistance, containing a significantly small amount of a sublimable component, and a method for forming a pattern using the underlayer film are provided. The composition for forming an underlayer film contains a naphthalene formaldehyde polymer having a specific unit obtained by reacting naphthalene and/or alkylnaphthalene with formaldehyde, and an organic solvent.

18 Claims, No Drawings

COMPOSITION FOR FORMING BASE FILM FOR LITHOGRAPHY AND METHOD FOR FORMING MULTILAYER RESIST PATTERN

TECHNICAL FIELD

The present invention relates to a composition for forming an underlayer film for lithography that is effective in a multilayer resist process used in microfabrication in a production process of a semiconductor device or the like, and a method for forming a photoresist pattern using the composition for forming an underlayer film for lithography.

BACKGROUND ART

In the production of a semiconductor device, microfabrication by lithography using a photoresist composition has been conventionally performed. According to the increase in integration degree and operation speed of an LSI in recent years, further microfabrication is demanded by the design rule of the pattern, and under the circumstances, the lithography technique associated with exposure to light, which is currently used as a general-purpose technique, is approaching the essential limit of resolution due to the wavelength of the light source. The light source for lithography used for forming a resist pattern is being decreased in wavelength from KrF excimer laser (248 nm) to ArF excimer laser (193 nm). However, various problems arise due to further microfabrication.

One of the major issues relates to the aspect ratio. An ArF resist is relatively low in etching resistance and thus is necessarily increased in aspect ratio, but it is difficult to increase the aspect ratio due to collapse of the resist pattern. As a method for forming a pattern with a high aspect ratio, a three-layer resist method or the like has been proposed. In the method, a material for forming a ground coat is coated on a substrate and formed into a film by heating to form an underlayer film, and an intermediate film containing an inorganic film, such as a silica film, is formed thereon. A photoresist film is then provided thereon, and a resist pattern is formed by an ordinary photolithography technique. The intermediate film is etched with the resist pattern as a mask to transfer the pattern thereto, and then the underlayer film is etched using oxygen plasma with the patterned intermediate film as a mask, thereby forming a pattern on the substrate.

A two-layer resist method has also been proposed, which is favorable owing to the less number of process steps as compared to the three-layer resist method. In the two-layer resist method, after forming an underlayer film in the same manner as in the three-layer resist method, a photoresist film containing a silicone-containing polymer is formed as an upper layer thereof, forming a resist pattern by an ordinary photolithography technique, and etching using oxygen plasma is performed with the resist pattern as a mask to transfer the resist pattern to the underlayer film. Thereafter, etching using a carbon fluoride series gas is performed with the resist pattern as a mask, thereby forming a pattern on the substrate (Non-patent Document 1).

As a material for forming the underlayer film for 193 nm, a copolymer of polyhydroxystyrene and an acrylate ester is being generally studied. Polyhydroxystyrene has significantly strong absorption at 193 nm and has solely a high value around 0.6 for the extinction coefficient (k). The k value can be controlled to around 0.25 by copolymerizing an acrylate ester, which has a k value of substantially 0.

However, the acrylate ester is low in etching resistance upon etching the substrate as compared to polyhydroxystyrene, and furthermore, it is necessary to copolymerize the acrylate ester at a high proportion for decreasing the k value, which brings about consequently decrease in resistance upon etching the substrate. The etching resistance influences not only the etching rate but also generation of surface roughness after etching, and thus increase of the surface roughness after etching faces severe problem by copolymerization of the acrylate ester.

A naphthalene ring is one of structures that have high transparency at 193 nm as compared to a benzene ring and high etching resistance, and an underlayer film having a naphthalene ring or an anthracene ring has been proposed (Patent Document 1). However, a naphthol-copolycondensed novolak resin and a polyvinylnaphthalene resin have a k value of from 0.3 to 0.4 and fail to achieve the target transparency of from 0.1 to 0.3, and thus the transparency thereof is necessarily further increased. An acenaphtylene polymer (Patent Documents 2 and 3) has a low refractive index (n) at a wavelength of 193 nm as compared to 248 nm and a high k value, both of which fail to achieve the target values. Furthermore, proposals have been made for an underlayer film obtained by adding an acrylic resin to a naphthol-copolycondensed novolak resin (Patent Document 4), an underlayer film containing a polymer compound obtained by copolymerizing indene and a compound having a hydroxyl group or an epoxy group and having a double bond (Patent Document 5), and an underlayer film containing a polymer compound obtained by copolymerizing a novolak resin with fluorenebisphenol (Patent Document 6), but the target value k of from 0.1 to 0.3 has not yet been achieved.

Furthermore, the material for an underlayer film also involves a problem with a sublimable component. There is such a severe problem that a sublimable component forms crystals on the surface of the upper plate upon baking, and the crystals drop onto the wafer to form defects. Due to the reason, a material that contains a less amount of a sublimable component is demanded. The conventional material uses a polymer, such as a novolak resin, owing to the demand of etching resistance, but contains a monomer and unreacted dimer and oligomer, which have sublimability, and therefore, an increased number of process steps are required for removing the sublimable component, which largely influences the production cost.

Accordingly, such a material for an underlayer film is demanded that has a high refractive index (n) and a low extinction coefficient (k), is transparent, has high etching resistance, and contains a considerably small amount of a sublimable component.

[Patent Document 1] JP-A-2002-14474
[Patent Document 2] JP-A-2001-40293
[Patent Document 3] JP-A-2002-214777
[Patent Document 4] JP-A-2005-156816
[Patent Document 5] JP-A-2006-53543
[Patent Document 6] JP-A-2007-17867
[Non-patent Document 1] PROCEEDINGS of SPIE, vol. 4345 (2001), 50

DISCLOSURE OF THE INVENTION

Problems to be Solved by the Invention

An object of the present invention is to provide a composition for forming an underlayer film for lithography that imparts excellent optical characteristics and etching resistance to an underlayer film for lithography, to provide an underlayer film that is formed with the composition, has a high refractive index (n) and a low extinction coefficient (k), is transparent, has high etching resistance, and contains a considerably small amount of a sublimable component, and to provide a method for forming a pattern using the underlayer film.

Means for Solving the Problems

As a result of earnest investigations made by the inventors for achieving the object, it has been found that a composition for forming an underlayer film for lithography that contains a naphthalene formaldehyde polymer obtained by reacting naphthalene and/or alkylnaphthalene with formaldehyde, and an organic solvent, in which the polymer contains a specific unit, is excellent in the optical characteristics and the etching resistance and is a promising material as an underlayer film for a multi-layer resist process, and thus the present invention has been completed.

Advantages of the Invention

The use of the composition for forming an underlayer film for lithography of the present invention provides an underlayer film that has a low reflectance for light with a short wavelength, such as excimer laser light of KrF, ArF, and is excellent in the etching resistance for oxygen plasma etching and the like, and the use of the underlayer film provides an excellent resist pattern.

BEST MODE FOR CARRYING OUT THE INVENTION

Composition for Forming Underlayer Film for Lithography

The present invention relates to a material for an underlayer film for forming an underlayer film between a substrate and a resist layer, which is a composition for forming an underlayer film for lithography containing at least a naphthalene formaldehyde polymer obtained by reacting naphthalene and/or alkylnaphthalene with formaldehyde, and an organic solvent.

The polymer in the composition for forming an underlayer film of the present invention is formed from naphthalene and/or alkylnaphthalene and formaldehyde as raw materials, and for example, phenol, a phenol derivative, naphthol, a naphthol derivative and the like may be used in addition to the raw materials. The polymer may be such a polymer that is obtained by a method including multiple reaction steps, in which upon providing the polymer, for example, naphthalene and/or alkylnaphthalene is reacted with formaldehyde, and then the polymer is modified with phenol, a phenol derivative, naphthol, a naphthol derivative or the like, thereby providing the target polymer.

Alkylnaphthalene

The alkylnaphthalene used for providing the polymer used in the present invention is one of or a mixture of two or more of selected from the group consisting of α-methylnaphthalene, β-methylnaphthalene, 1,2-dimethylnaphthalene, 1,3-dimethylnaphthalene, 1,4-dimethylnaphthalene, 1,5-dimethylnaphthalene, 1,6-dimethylnaphthalene, 1,7-dimethylpnanthalene, 1,8-dimethylnaphthalene, 2,3-dimethylnaphthalene, 2,6-dimethylnaphthalene, 2,7-dimethylnaphthalene, trimethylnaphthalene, tetramethylnaphthalene, acenaphthene, methylacenaphthene, cyclohexylnaphthalene, norbornylnaphthalene, tricyclodecanylnaphthalene, adamantylnaphthalene, decanylnaphthalene and bicyclooctylnaphthalene. In total consideration of superiority of availability of the raw materials, easiness in production of the resin, the optical characteristics and the like, 1,5-, 2,6-, 2,7- and 1,8-dimethylnaphthalene and acenaphthene are preferred, and 1,5-dimethylnaphthalene is particularly preferred. The alkylnaphthalene has high transparency at 193 nm and has a high refractive index, and thus exhibits excellent capability as a material for an underlayer film suitable for exposure technique using ArF excimer laser.

The aforementioned 1,5-, 2,6-, 2,7- and 1,8-dimethylnaphthalene have a structure that has one methyl group on each of the two aromatic rings of the naphthalene ring, and thus forms a polyfunctional resin through condensation reaction with formaldehyde in the presence of an acidic or alkaline catalyst. In the case where unsubstituted naphthalene, monomethylnaphthalene, or 1,2-dimethylnaphthalene, 1,3-dimethynaphthalene and 1,4-dimethylnaphthalene, in which only one of the aromatic rings of the naphthalene ring is dimethylated, is used as a raw material, a polyfunctional resin cannot be obtained unless a special reaction mode, such as interface reaction, is employed. In the case where a trimethyl or higher substituted naphthalene compound is used, a polyfunctional resin cannot be obtained since the amount of reaction sites is decreased.

The term "polyfunctional" of the polyfunctional resin means that among the six hydrogen atoms directly bonded to the naphthalene ring, the average value of the number of hydrogen atoms that are substituted through reaction for producing the naphthalene formaldehyde polymer (resin) (which may be hereinafter referred to as "an average value of substituted hydrogen atom number per one naphthalene ring in the resin") exceeds 1.5.

Formaldehyde

Examples of the formaldehyde as the raw material of the resin of the present invention include industrially available compounds that generate formaldehyde, such as formalin, paraformaldehyde and trioxane. The molar ratio of the raw materials, dimethylnaphthalene and formaldehyde, upon subjecting to condensation reaction is preferably from 1/1 to 1/6, and more preferably from 1/1.5 to 1/5.

Method for Producing Naphthalene Formaldehyde Polymer

The condensation reaction of naphthalene and/or alkylnaphthalene with formaldehyde in the present invention is preferably carried out in the presence of a catalyst. Examples of the catalyst used in the condensation reaction include sulfuric acid and p-toluenesulfonic acid, as an acidic catalyst, and sulfuric acid is generally suitable. Examples thereof also include sodium hydroxide, calcium hydroxide, magnesium hydroxide and an organic amine compound, as an alkaline catalyst, and an organic amine compound is generally suitable in consideration of contamination with a metallic component. The using amount thereof is desirably from 30 to 55% by weight in terms of concentration in the components including formaldehyde, water and sulfuric acid.

The formaldehyde concentration in the condensation reaction of the resin of the present invention is from 20 to 40% by weight in the raw material components including formaldehyde, water and sulfuric acid, and a practically favorable reaction rate can be obtained at the concentration.

The condensation reaction of the resin of the present invention is generally carried out under ordinary pressure with refluxing at 100° C., which is the boiling point of water, and may be carried out under slightly increased pressure depending on necessity. In the case where a dialkylnaphthalene having a melting point of 100° C. or more is used as a raw material, the reaction is preferably carried out under slightly increased pressure for providing a reaction temperature that is higher than the melting point. Furthermore, an aromatic hydrocarbon or aliphatic hydrocarbon solvent that is inert to the condensation reaction may be used as a diluting solvent.

The condensation reaction time of the resin of the present invention is desirably approximately from 4 to 8 hours, and a polyfunctional resin that has the target properties can be obtained economically with the reaction time.

After the condensation reaction of the resin of the present invention, the naphthalene formaldehyde polymer used in the present invention is obtained in such a manner that adding a diluting solvent thereto depending on necessity, the reaction mixture is allowed to stand for separating into two phases, the resin phase as the oily phase is separated from the aqueous phase and rinsed with water to remove the catalyst completely, and the diluting solvent added and the unreacted dimethylnaphthalene as a raw material are removed by an ordinary method, such as distillation.

Constitutional Unit 1

The naphthalene formaldehyde polymer used in the present invention has a constitutional unit (1) represented by the following general formula (1).

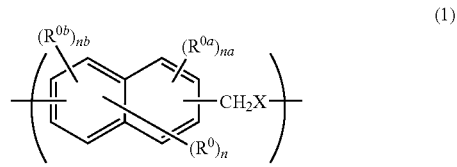

In the formula (1), $R^0$ represents a hydrogen atom, a methoxymethyl group or a hydroxymethyl group, and preferably represents a methoxymethyl group or a hydroxymethyl group, in which plural groups represented by $R^0$ may be the same as or different from each other. $R^{0a}$ and $R^{0b}$ each independently represent a hydrogen atom or an alkyl group having from 1 to 3 carbon atoms, which may be bonded to each other to form a ring structure. The state where $R^{0a}$ and $R^{0b}$ are bonded to each other to form a ring structure means that $R^{0a}$ and $R^{0b}$ are bonded to each other to form an alkylene group that is bonded to the naphthalene structure. For example, in the case where $R^{0a}$ and $R^{0b}$ each are a methyl group, they are bonded to each other to form an ethylene group, and thus the constitutional unit (1) has an acenaphthene structure. $R^{0a}$ and $R^{0b}$ are each preferably a methyl group or an ethyl group, and more preferably a methyl group. Plural groups represented by each of $R^{0a}$ and $R^{0b}$ may be the same as or different from each other.

X represents a functional group represented by $-(OCH_2)_t-$, in which t represents an integer of from 0 to 2. The use of the constitutional unit having an acetal bond provides higher etching resistance and suppression of intermixing without the use of a crosslinking agent and a photoacid generating agent, which are relatively expensive, and in the case where the outgas is demanded to be decreased, t is preferably 0. In the case where low temperature thermosetting property is demanded, t is preferably 1 or 2. In the case where t is 3 or more, the heat resistance may be lowered in some cases. n represents an integer of from 0 to 6, and na and nb each represent an integer of from 0 to 3, provided that the condition $0 \leq n+na+nb \leq 6$ is satisfied.

The constitutional unit (1) represented by the general formula (1) is particularly preferably a constitutional unit (2) represented by the following general formula (2) since it is good in availability and has excellent balance among the solubility in a solvent, the film forming property, the optical characteristics, the heat resistance and the like.

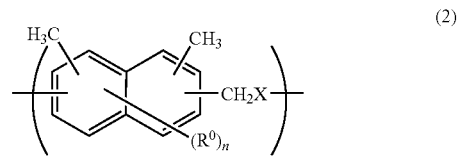

In the formula (2), $R^0$, X and n have the same meanings as above.

The polymer used in the present invention may contain constitutional units represented by the following general formulae in an amount of less than 50% by mol, but may be insoluble in a solvent when it is contained in an amount of 50% by mol or more. The use of the constitutional units represented by the following general formulae contained may improve the optical characteristics, the etching resistance, the thermosetting property and the like.

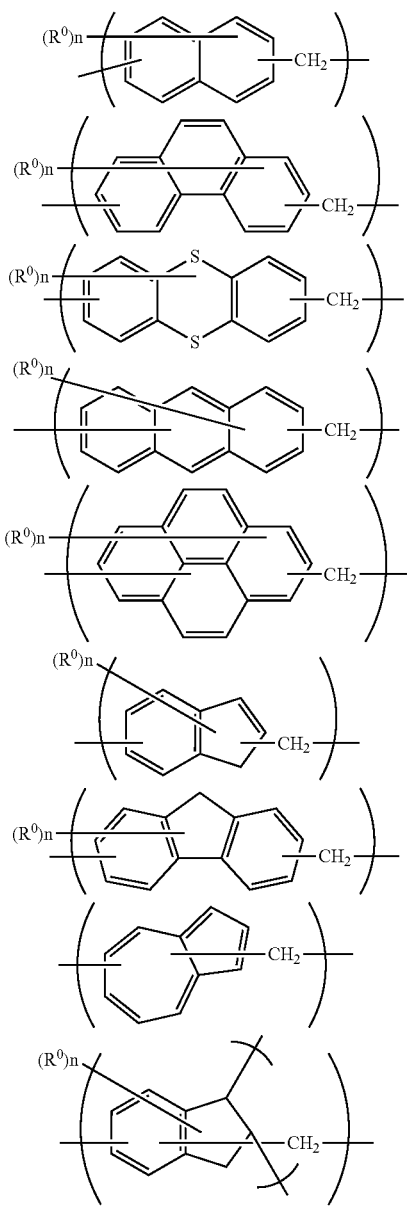

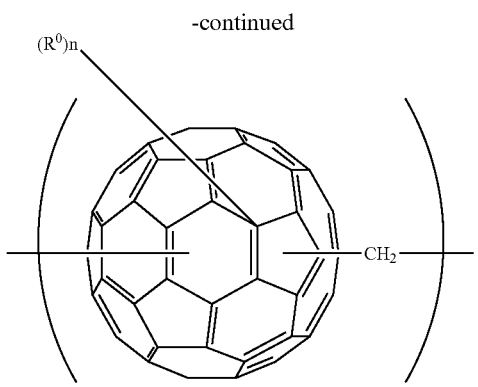

In the formulae, $R^0$ and n have the same meanings as above.

The naphthalene formaldehyde polymer gives a modified naphthalene formaldehyde resin by adding an aromatic hydrocarbon compound, such as anthracene, phenanthrene, pyrene, acenaphthene, indene, fluorene or fullerene, to the polymer obtained by reacting naphthalene and/or alkylnaphthalene with formaldehyde with the use of a catalyst, such as sulfuric acid or p-toluenesulfonic acid.

Constitutional Unit (3)

The naphthalene formaldehyde polymer preferably contains a constitutional unit (3) represented by the following general formula (3). The use of the constitutional unit (3) contained in the polymer provides a composition for an underlayer film that is excellent in the intermixing property, the optical characteristics, the etching resistance, and the low sublimation property.

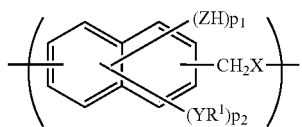

(3)

In the formula (3), X has the same meaning as above. $R^1$ represents a hydrogen atom or at least one kind of a functional group selected from the group consisting of norbornane, cyclohexane, tricyclodecane, adamantane, decalin, bicyclooctyl and acenaphthene, and tricyclodecane is preferred. Plural groups represented by $R^1$ may be the same as or different from each other. Y represents —CO— or a single bond, and Z represents an oxygen atom or a sulfur atom, in which plural members represented by each of Y and Z may be the same as or different from each other. Z is preferably a sulfur atom for enhancing the refractive index of the underlayer film, but in this case, the etching resistance may be lowered in some cases. Z may be appropriately selected depending on the desired capability, and an oxygen atom is preferred in consideration of the balance between the economy and the capability.

p1 and p2 represent integers that satisfy $1 \leq p1 \leq 2$ and $0 \leq p2 \leq 4$.

The polymer containing the constitutional unit represented by the general formula (3) of the present invention can be obtained by reacting a compound having an alicyclic structure represented by the following general formula (3a) in the presence of formalin and an acid or alkaline catalyst. The compound represented by the general formula (3a) is preferably naphthol or a naphthol derivative. The reaction temperature is preferably from 100 to 250° C., and particularly preferably from 180 to 230° C. Formalin may be added during the reaction. Trioxane may be used instead of formalin.

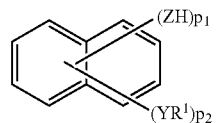

(3a)

In the formula (3a), $R^1$, Y, Z, p1 and p2 have the same meanings as above.

Examples of the compound having an alicyclic structure represented by the general formula (3a) include the following.

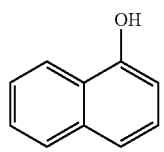
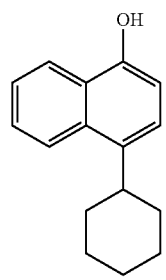

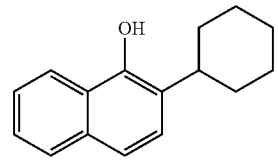
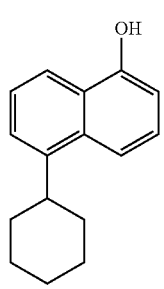

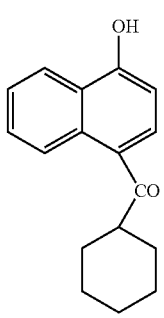
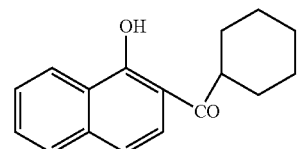

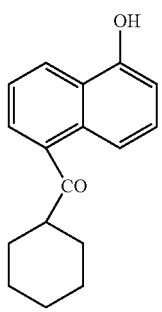
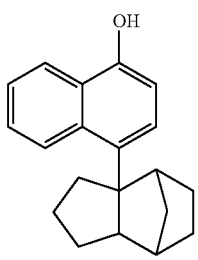

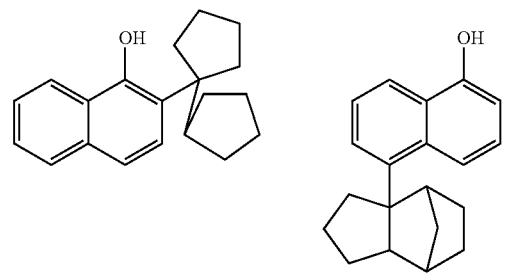
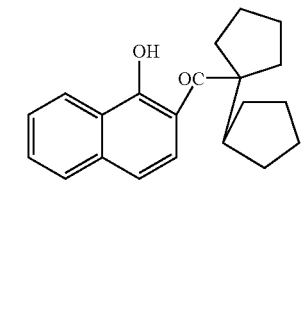
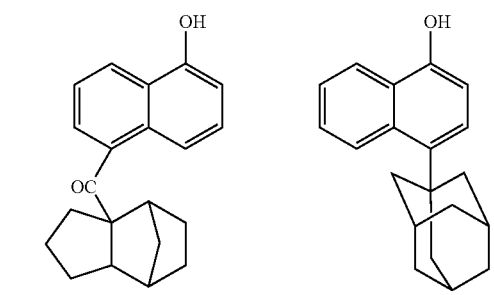
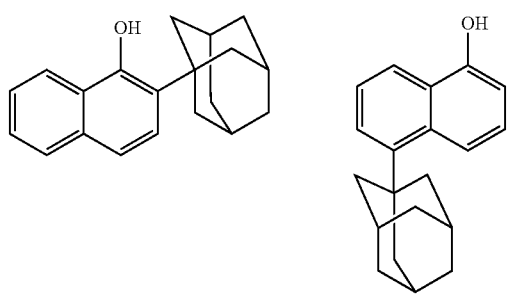
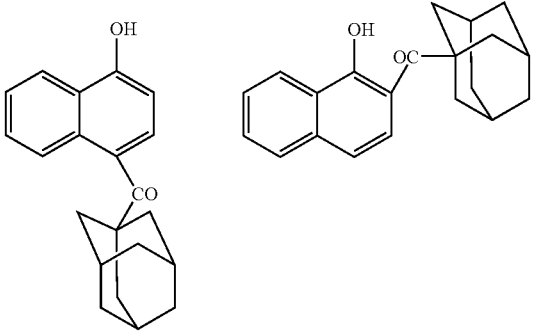
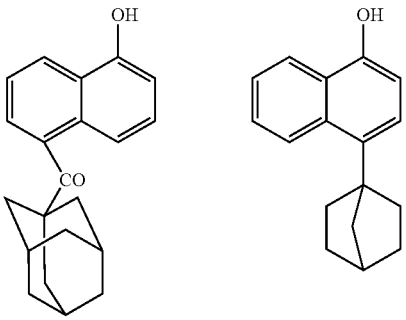
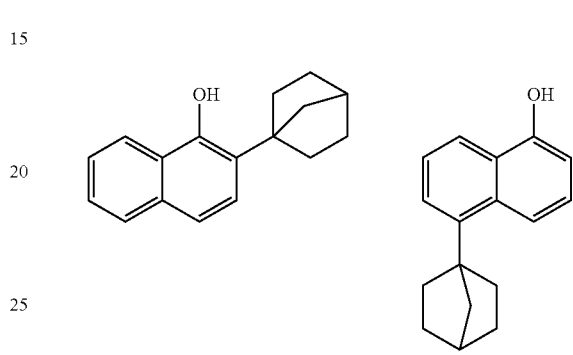
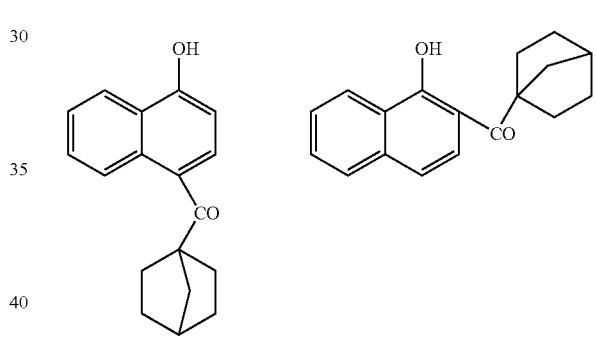
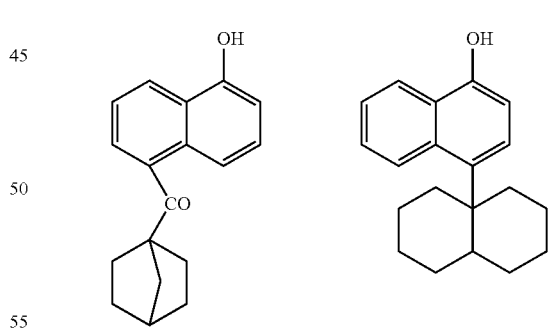
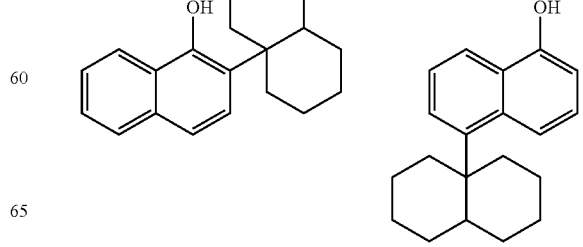

-continued
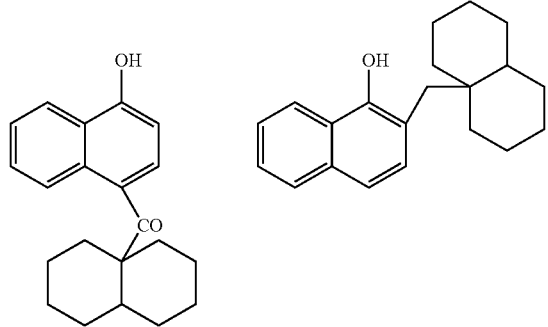
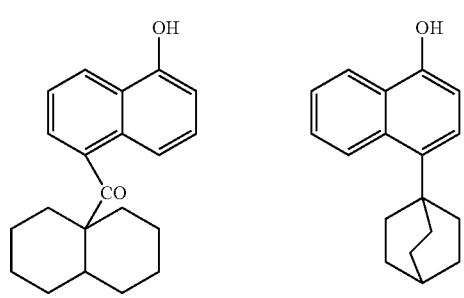
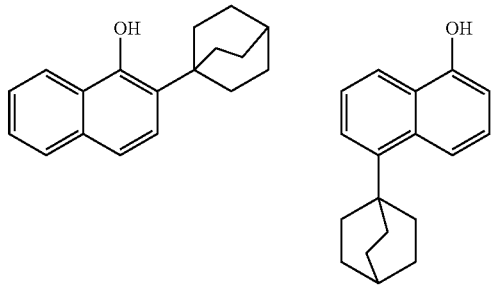
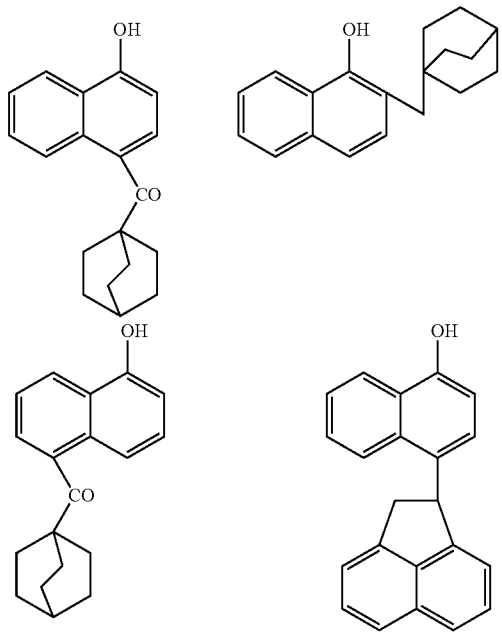
-continued
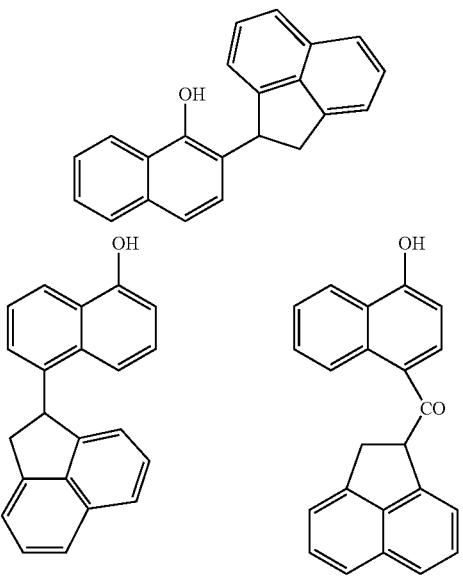
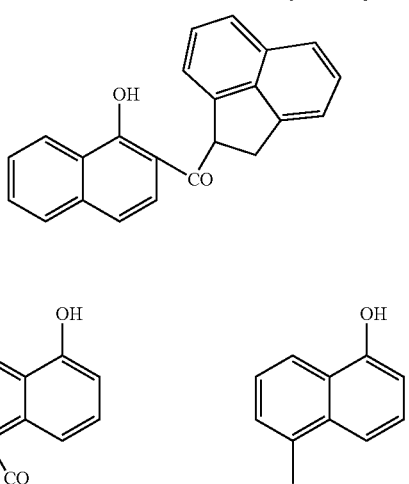
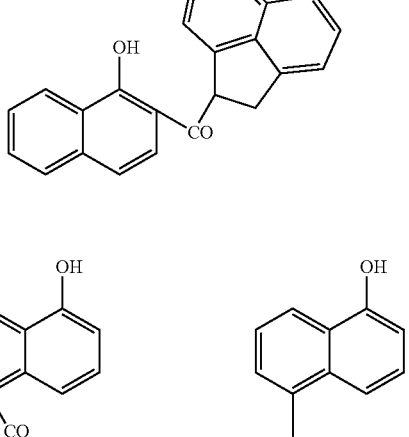
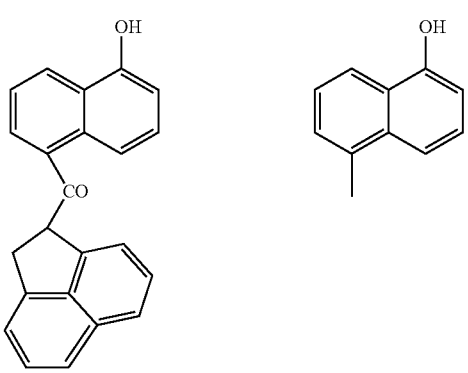
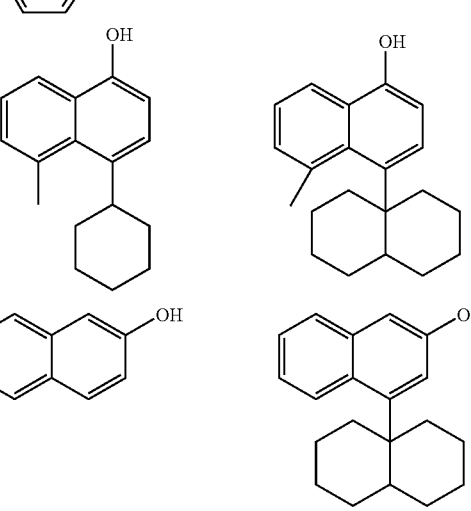

-continued
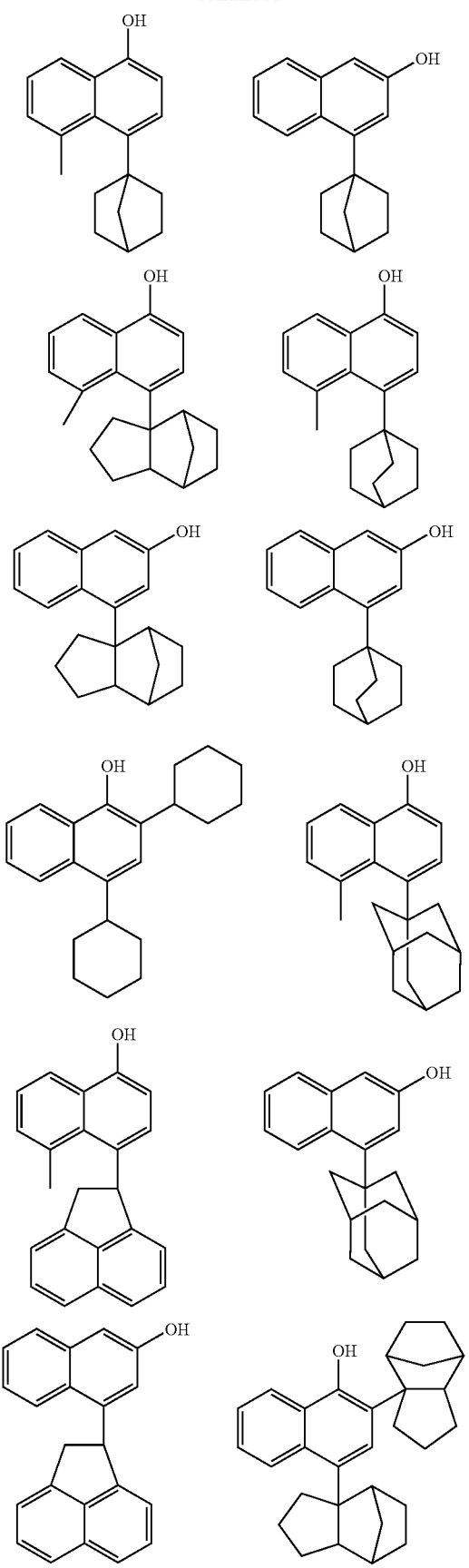
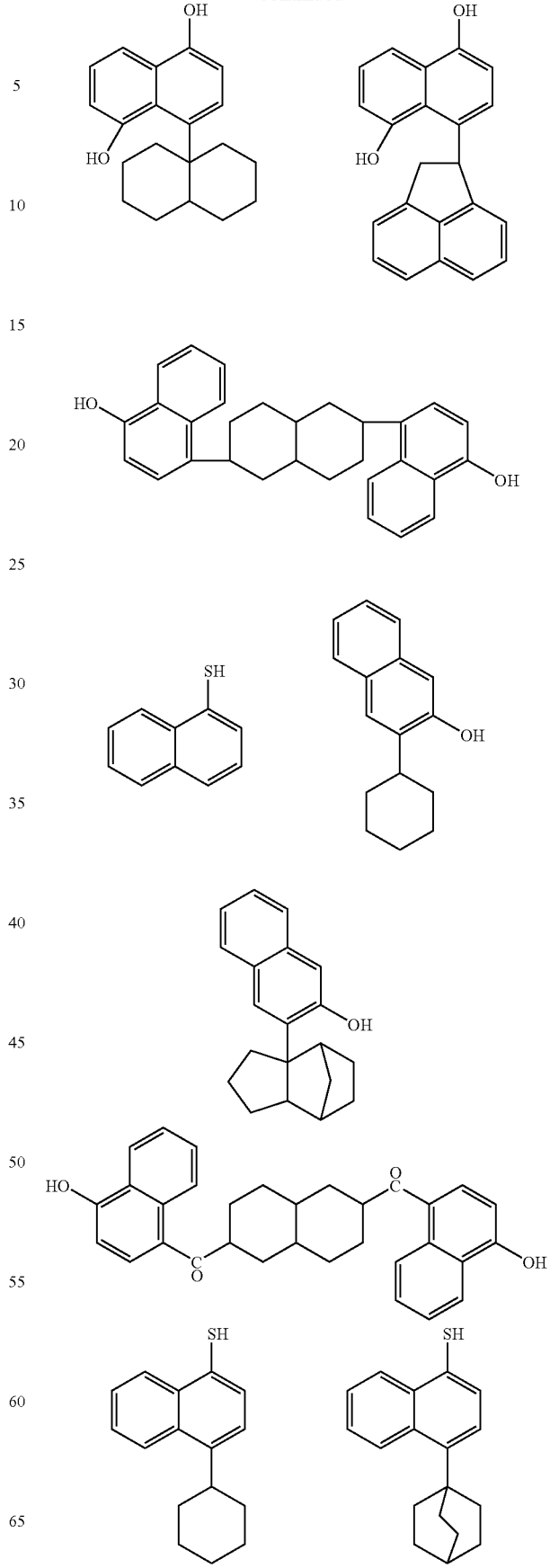

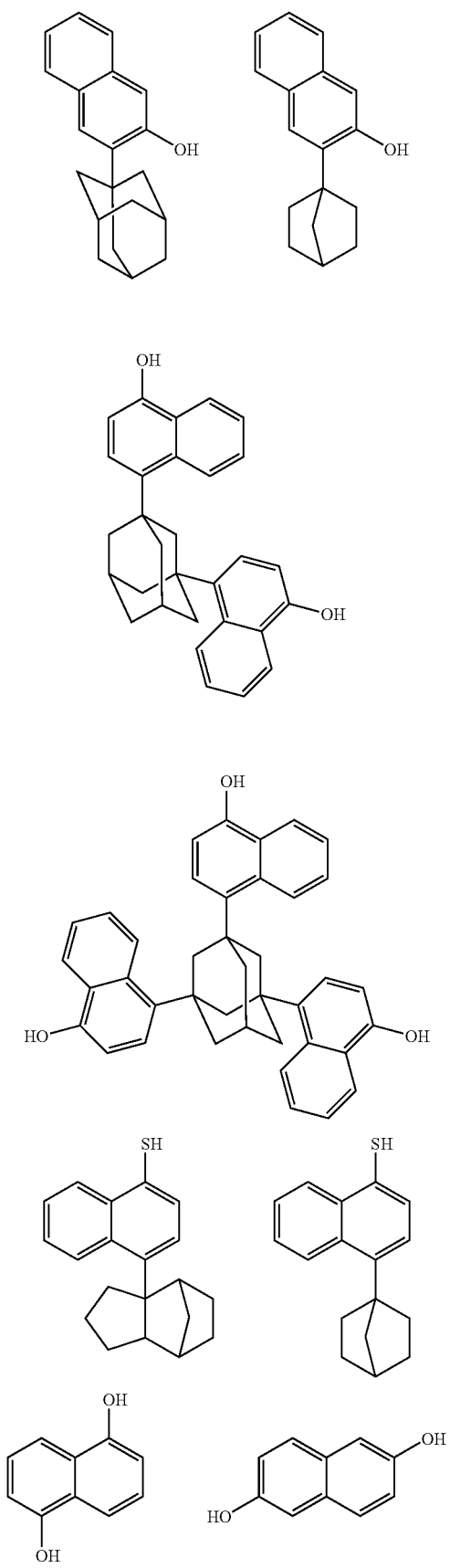

-continued

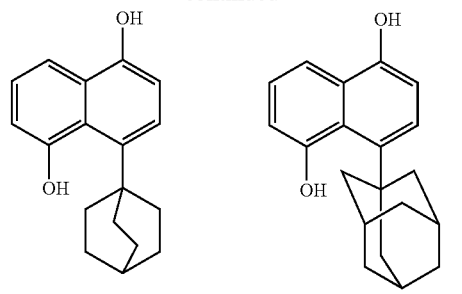

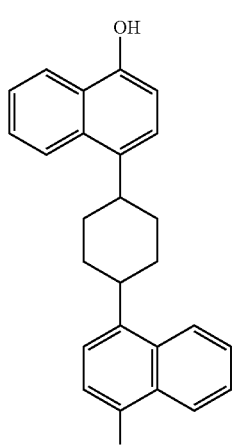

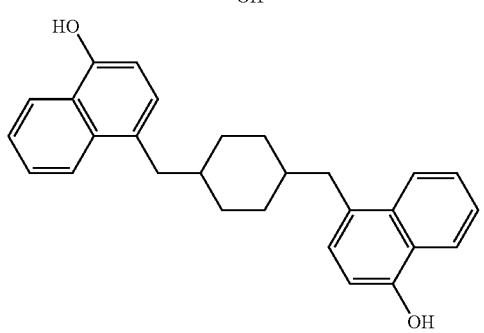

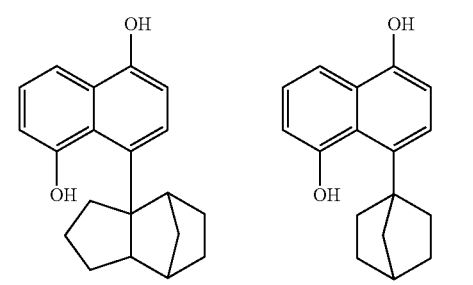

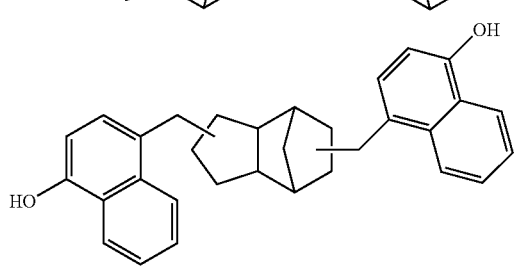

-continued

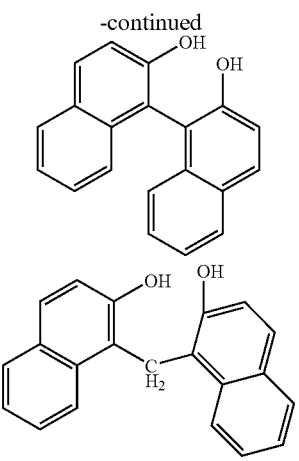

Among the aforementioned compounds, naphthol and a naphthol derivative are preferred. A naphthol derivative and a naphthalenediol derivative are obtained by performing alkylating reaction of naphthol or naphthalenediol with an alkene, an alcohol or a halogenated compound having an alicyclic structure by using an acidic catalyst. Ester exchange reaction is carried out with an esterified compound having an alicyclic structure, and then Fries rearrangement is performed with a Lewis acid catalyst or the like, thereby providing a ketone compound through a carbonyl group.

By containing the constitutional unit (3) in the naphthalene formaldehyde polymer, the underlayer film formed with the composition for forming an underlayer film for lithography of the present invention is excellent in the optical characteristics at 193 nm and dry etching resistance. The constitutional unit (3) particularly preferably contains a tricyclodecane structure and an α-naphthol (1-naphthol) structure since the balance between the capability and the raw material cost is improved.

Constitutional Unit (4)

The naphthalene formaldehyde polymer preferably contains a constitutional unit (4) represented by the following general formula (4). The constitutional unit (4) is preferably contained from the standpoint of the low sublimation property and the optical characteristics.

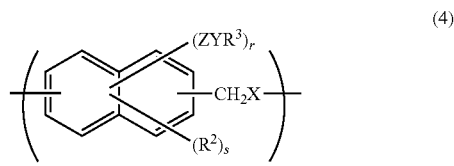

(4)

In the formula (4), $R^2$ represents a hydrogen atom, a hydroxyl group or a hydrocarbon group having from 1 to 10 carbon atoms, $R^3$ represents at least one kind of a functional group selected from the group consisting of norbornane, cyclohexane, tricyclodecane, adamantane, decalin and bicyclooctyl. Examples of the hydrocarbon group include an alkyl group, an alkoxy group, an aromatic hydrocarbon group, an aryloxy group, an aralkyl group, an alkenyl group, a cycloalkyl group, an alkylamino group, an arylamino group and an aralkylamino group. The hydrocarbon groups may be linear, branched or cyclic, and may be substituted. Among these, a linear or cyclic alkyl group is preferred. Plural groups represented by each of $R^2$ and $R^3$ may be the same as or different from each other.

r and s represent integers that satisfy 1≤r≤2 and 0≤s≤4. X, Y and Z have the same meanings as above.

The polymer containing the constitutional unit (4) of the present invention can be obtained by reacting a compound having an alicyclic structure represented by the following general formula (5) in the presence of formalin and an acid or alkaline catalyst. The compound represented by the general formula (5) is preferably a naphthol derivative. By reacting in the presence of an alkaline catalyst, the resin can be modified to a resol type resin. The resol type resin can undergo self thermosetting and is preferably used in a purpose where low temperature baking is required.

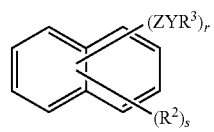
(5)

In the formula (5), $R^2$, $R^3$, Y, Z, r and s have the same meanings as above.

Specific examples of the compound represented by the general formula (5) include compounds having the following structures.

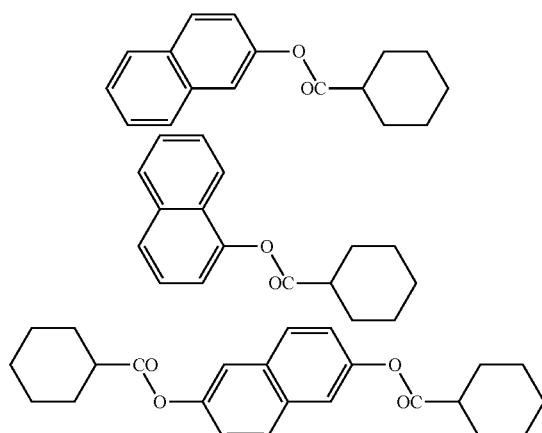

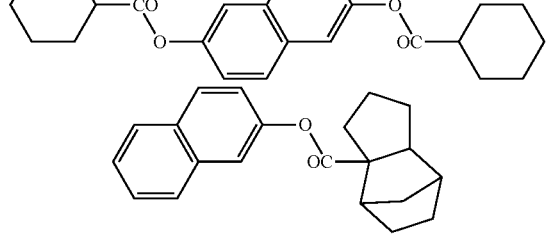

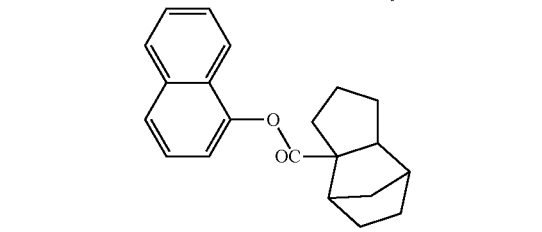

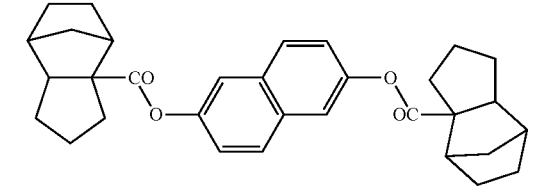

-continued

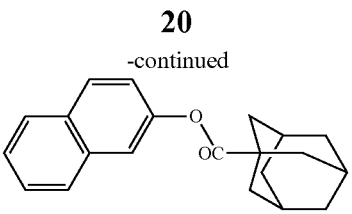

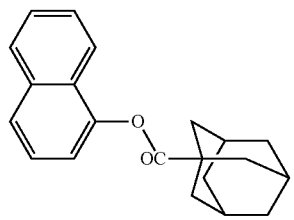

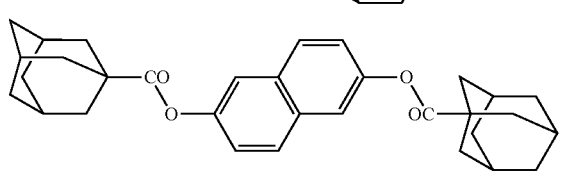

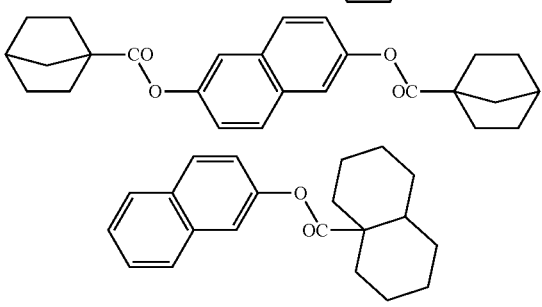

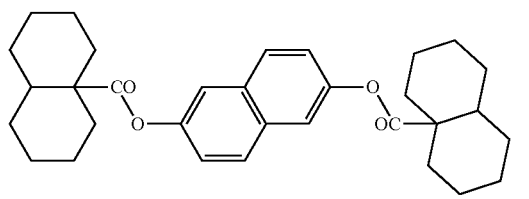

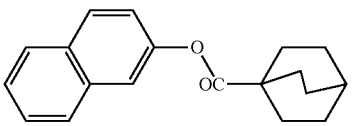

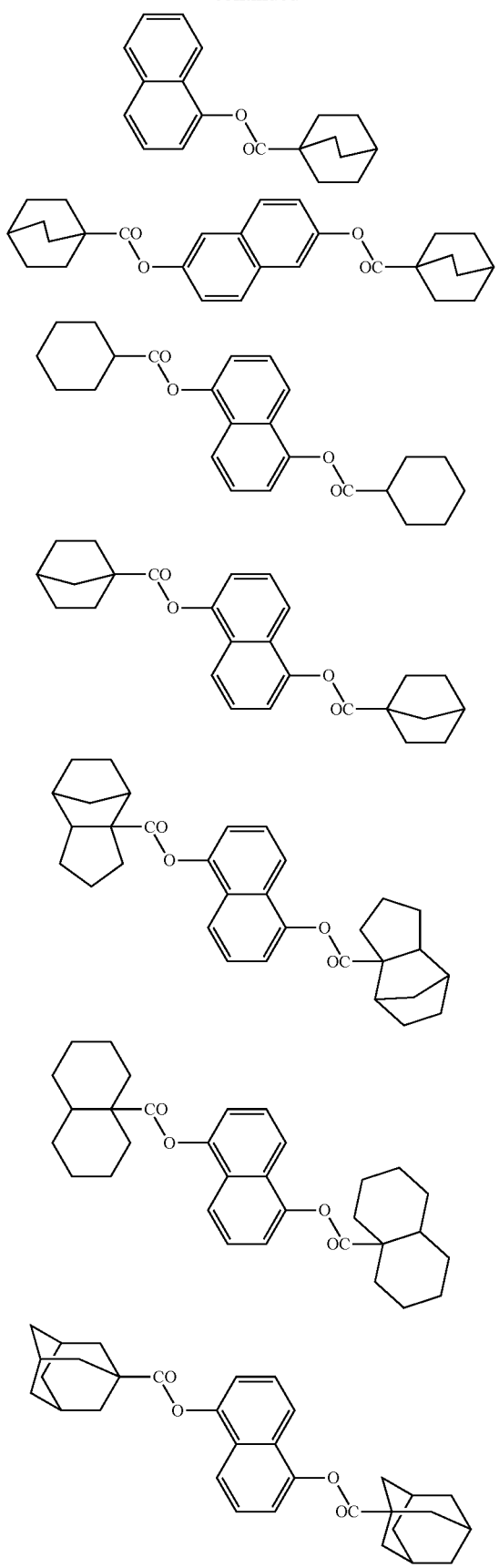

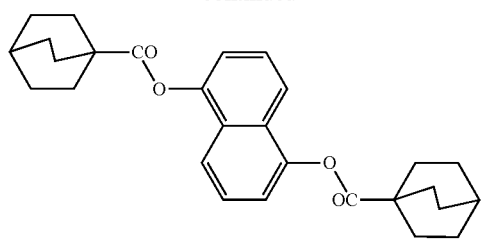

By containing the constitutional unit represented by the general formula (4) in the naphthalene formaldehyde polymer, the underlayer film formed from the composition for forming an underlayer film for lithography of the present invention is excellent in the optical characteristics at 193 nm and the dry etching resistance. The constitutional unit (4) particularly preferably contains a tricyclodecane structure and an α-naphthol (1-naphthol) structure from the standpoint of the balance between the capability and the raw material cost. There are some cases where α-naphthol exhibits deteriorated thermal stability, and thus the amount thereof is preferably 50% by weight or less based on the alkylnaphthalene resin.

The molecular weight of the naphthalene formaldehyde polymer used in the present invention is not limited, and when Mw exceeds 50,000, there are some cases where it cannot be spin-coated due to increase of the viscosity. Mw is preferably from 1,000 to 10,000, and more preferably from 2,000 to 5,000. Within the range, excellent solubility and excellent heat resistance and outgas reduction can be achieved.

The residual metal amount of the naphthalene formaldehyde polymer is preferably 1,000 ppb or less, more preferably 100 ppb or less, and particularly preferably 50 ppb or less. Examples of the method for reducing the residual metal amount include a method of rinsing the resin solution with ultrapure water or the like and a method of making it in contact with an ion exchange resin, but the method is not particularly limited.

Constitutional Unit (10)

The composition for forming an underlayer film for lithography of the present invention preferably contains a naphthalene formaldehyde polymer containing a constitutional unit (10) represented by the following general formula (10). As the constitutional unit (10), a constitutional unit (11) represented by the general formula (11) is preferred.

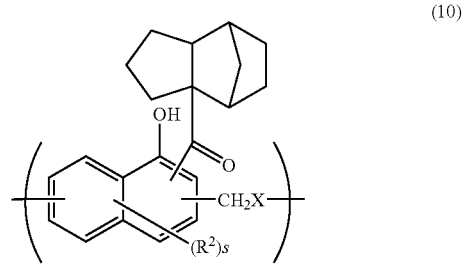
(10)

-continued

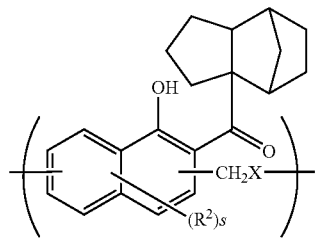
(11)

In the formulae (10) and (11), $R^2$, X and s have the same meanings as above.

By containing the constitutional units (10) and (11), the composition for forming an underlayer film for lithography of the present invention is excellent in the optical characteristics and the etching resistance.

In the polymer used in the present invention, an epoxy group may be introduced into the phenolic hydroxyl group. An epoxy group can be introduced by reaction between a resin having a phenolic hydroxyl group and an epoxy group-containing compound, such as epichlorohydrin, through action of a base. The use of an epoxy group introduced enhances the curing property of the resin and reduces the outgas property thereof.

Constitutional Units (9) and (12)

The naphthalene formaldehyde polymer containing the constitutional unit represented by the general formula (4) is preferably a modified dimethylnaphthalene formaldehyde resin having a constitutional unit represented by the following general formula (9) in the molecule thereof.

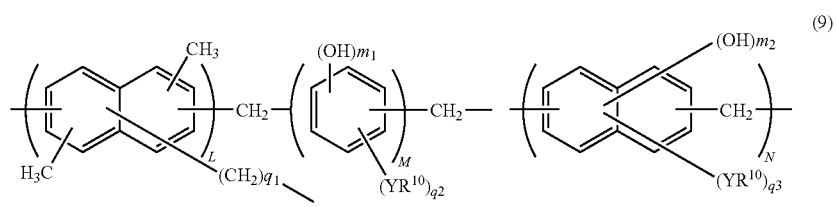
(9)

In the formula (9), $R^{10}$ represents at least one kind of a functional group selected from the group consisting of norbornane, cyclohexane, tricyclodecane, adamantane, decalin, bicyclooctyl and acenaphthene, and plural groups represented by $R^{10}$ may be the same as or different from each other. The functional group represented by is preferably tricyclodecane.

L, M and N represent the constitutional molar percentage of the dimethylnaphthalene formaldehyde resin, the constitutional molar percentage of the phenol compound and the constitutional molar percentage of the naphthol compound, respectively, based on the total amount of the constitutional units, and are values satisfying L=20 to 80, M=0 to 80 and N=0 to 80, provided that M and N are not simultaneously zero. L, M and N are preferably L=30 to 70, M=0 to 50 and N=20 to 70.

m1 and m2 each represent an integer of from 1 to 3, q1 represents an integer of from 0 to 4, q2 represents an integer of from 1 to 2, and q3 represents an integer of from 1 to 5. Y has the same meaning as above.

The naphthalene formaldehyde polymer containing the constitutional unit represented by the general formula (4) is preferably a modified dimethylnaphthalene formaldehyde resin having a constitutional unit represented by the following general formula (12) in the molecule thereof.

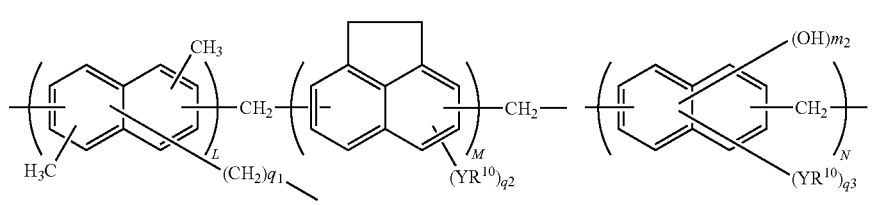
(12)

In the formula (12), $R^{10}$, Y, L, M, N, m2 and q1 to q3 have the same meanings as above.

The resin having the constitutional unit represented by the general formula (9) or (12) in the molecule thereof can be applied to a wide range of purposes including an electric insulating material, a material for an underlayer film for lithography, a resin for resist, a sealing resin for a semiconductor, an adhesive for a printed wiring board, a matrix resin for an electric laminated board and a prepreg, a material for a build-up laminated board, a resin for fiber-reinforced plastics, a sealing resin for a liquid crystal display panel, a paint composition, a coating composition of various kinds, an adhesive and the like. In particular, it is preferably used as a material for an underlayer film for lithography.

Polyphenol Compound (6)

The composition for forming an underlayer film for lithography of the present invention preferably contains at least one of polyphenol compounds represented by the following general formula (6). A hydrogenated aromatic ring compound of the polyphenol compound represented by the general formula (6) may be contained.

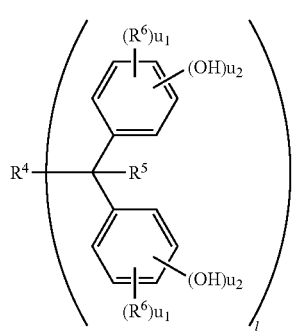

(6)

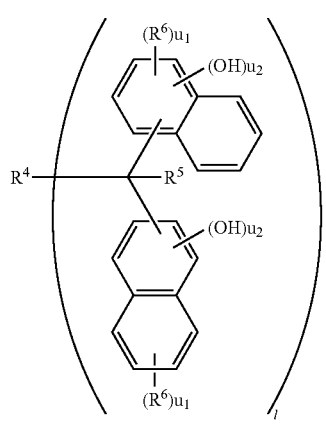

In the formula (6), R⁴ represents a monovalent to tetravalent substituent having from 10 to 18 carbon atoms having at least one structure selected from the group consisting of a naphthalene structure, a phenanthrene structure, a pyrene structure, a fluorene structure, an acenaphthene structure, a 1-ketoacenaphthene structure, a benzophenone structure, a xanthene structure, a thioxanthene structure, a norbornane structure, a cyclohexane structure, a tricyclodecane structure, an adamantane structure, a bicyclooctyl structure and hydrogenated aromatic ring structures of these structures.

$R^5$ represents a substituent selected from the group consisting of a hydrogen atom and an alkyl group having from 1 to 6 carbon atoms, and may be bonded to $R^4$ via a single bond.

$R^6$ represents a substituent selected from the group consisting of a halogen atom, an alkyl group having from 1 to 6 carbon atoms, an alkoxy group, norbornane, cyclohexane, tricyclodecane, adamantane, decalin and a bicyclooctyl group.

l represents an integer of from 1 to 4, u1 represents an integer of from 0 to 4, and u2 represents an integer of from 1 to 4, provided that the condition $1 \le u1+u2 \le 5$ is satisfied.

Plural groups represented by each of $R^5$, $R^6$, u1 and u2 may be the same as or different from each other.

Specific examples of the general formula (6) include those having the following structures.

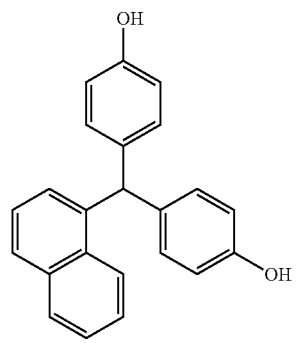

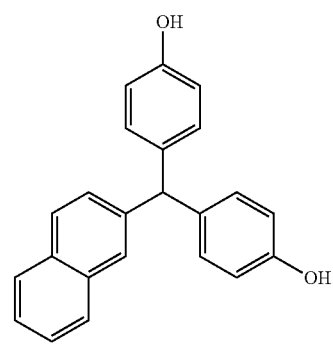

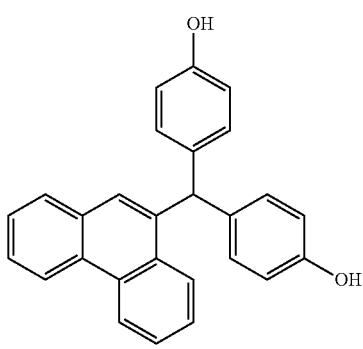

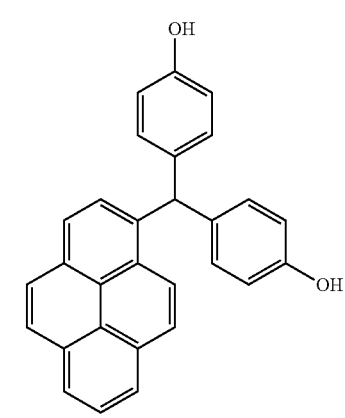

-continued
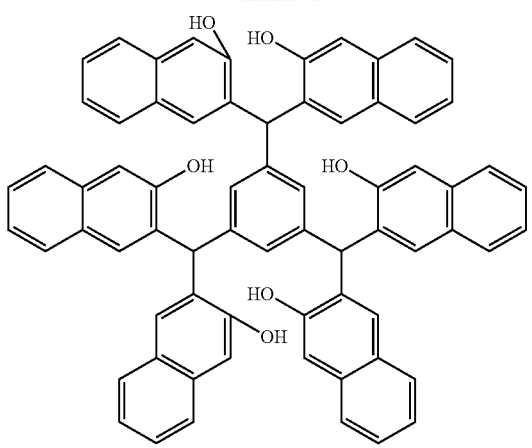
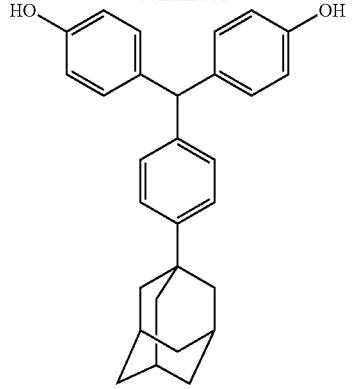
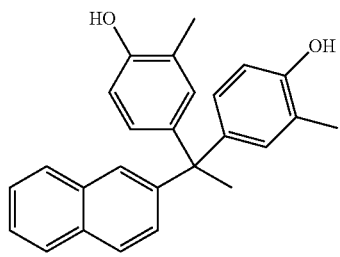
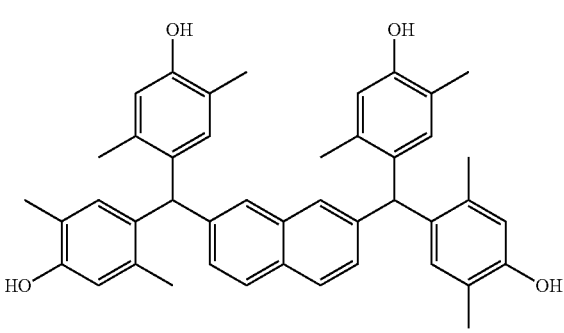
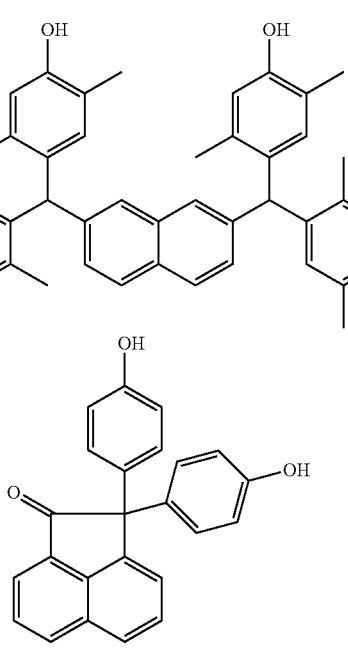
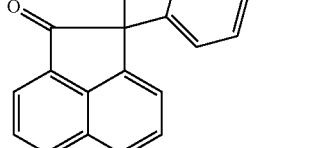
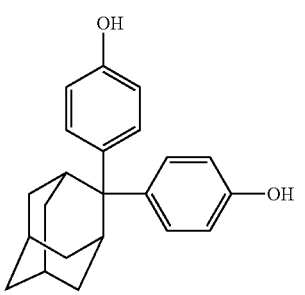
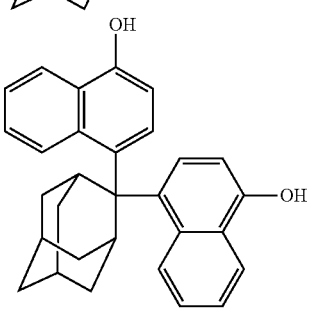

-continued
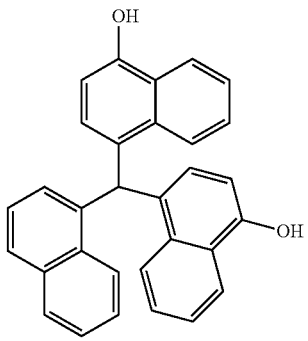
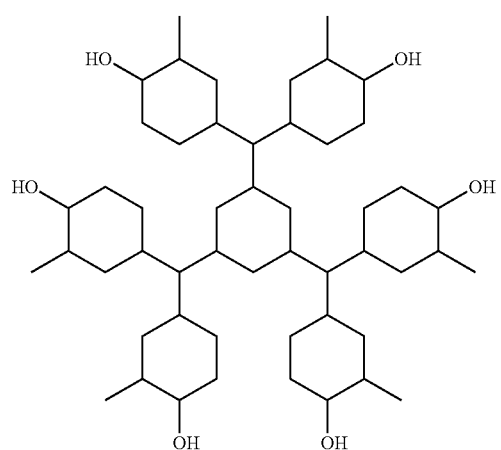
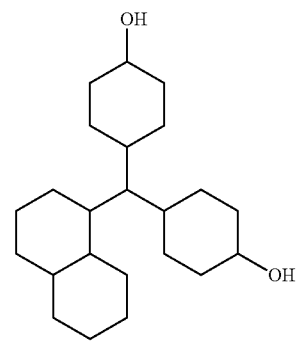
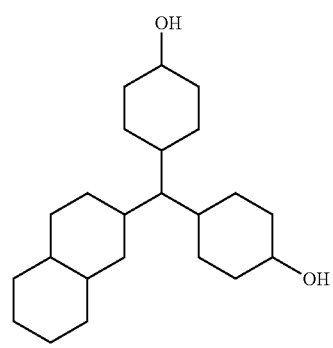
-continued
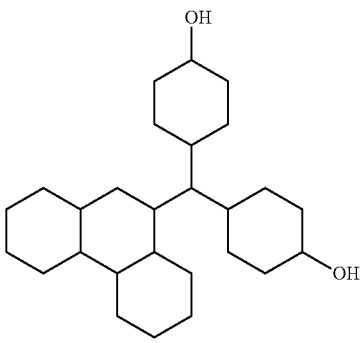
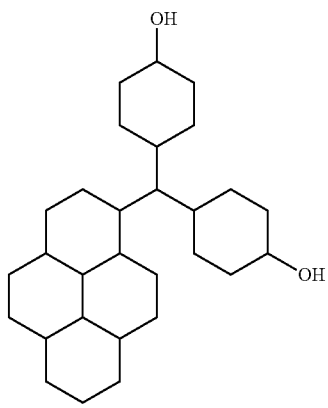
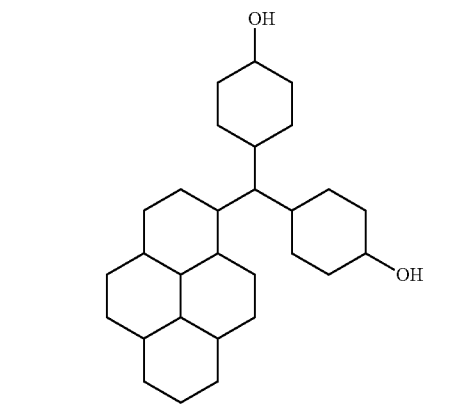
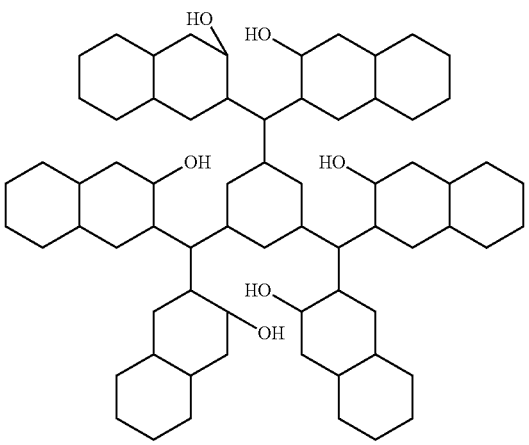
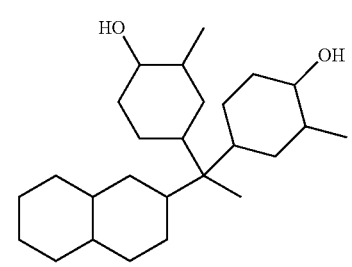

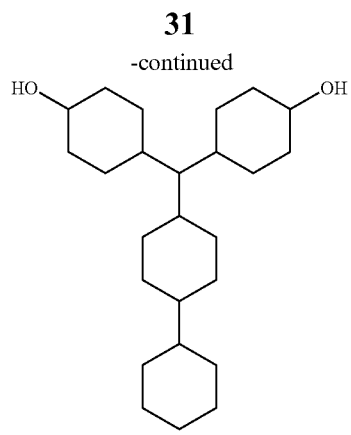

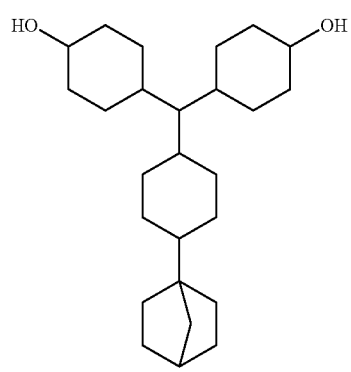

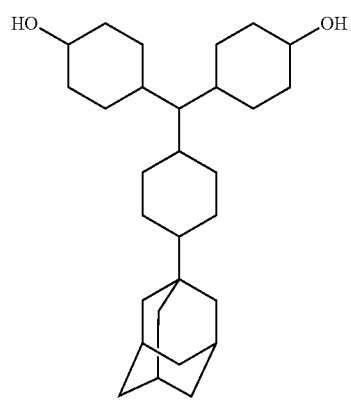

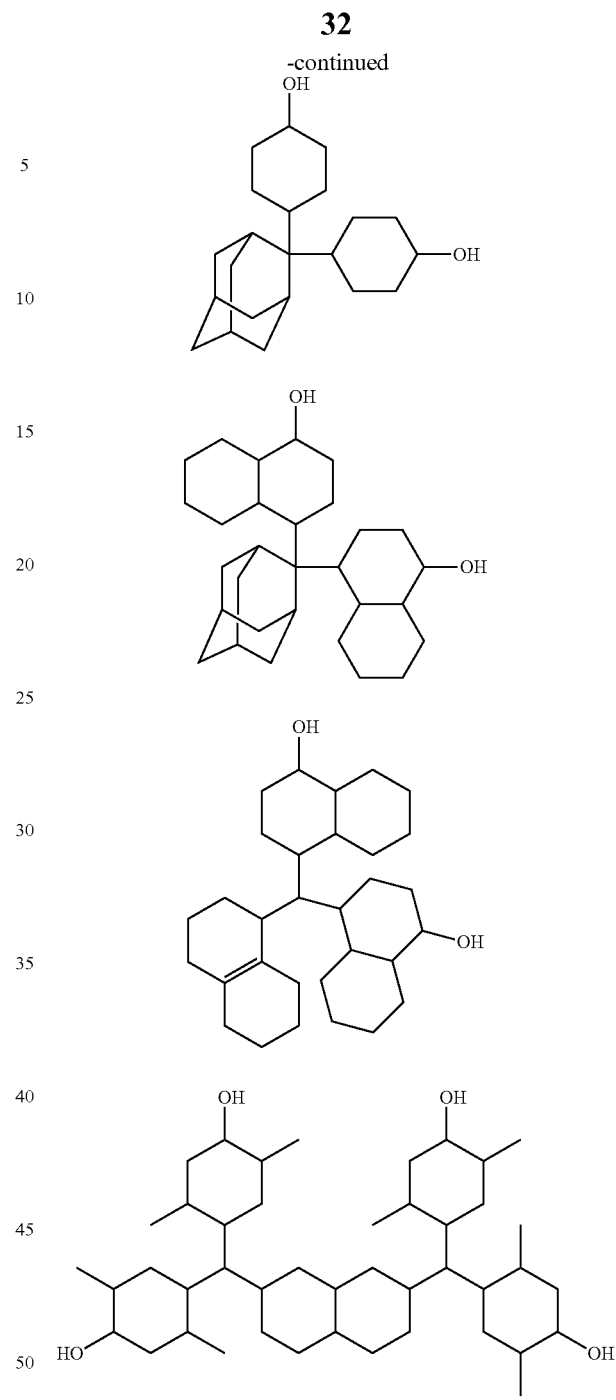

The glass transition point of the polyphenol compound represented by the general formula (6) and the hydrogenated aromatic ring compound thereof is desirably 110° C. or more, and more preferably 150° C. or more. In the case where the glass transition point is in the range, the composition for forming an underlayer film for lithography has excellent film forming property.

Cyclic Organic Compounds (7) and (8)

The composition for forming an underlayer film for lithography of the present invention preferably contains a cyclic organic compound represented by the following general formula (7) from the standpoint of enhancement of heat resistance and reduction of the sublimable component.

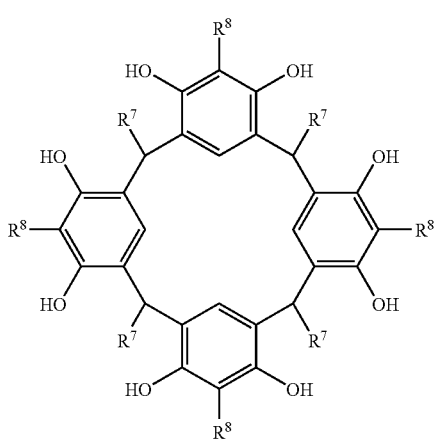

(7)

In the formula (7), $R^7$ independently represents an alkyl group having from 1 to 20 carbon atoms, an aryl group having from 6 to 24 carbon atoms, an allyl group, a hydroxyalkyl group, a cyanoalkyl group, a halogenoalkyl group, a hydroxyaryl group, a cyanoaryl group or a halogenoaryl group.

$R^8$ independently represents a hydrogen atom or a hydroxyl group.

The composition for forming an underlayer film for lithography of the present invention preferably contains a cyclic organic compound represented by the following general formula (8) from the standpoint of heat resistance.

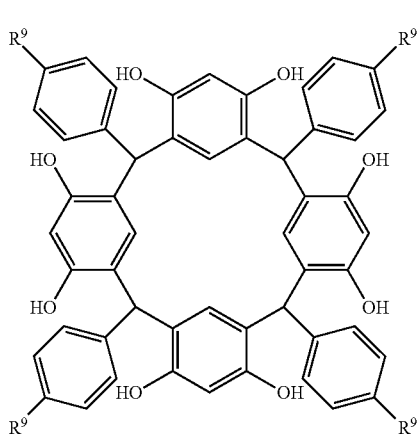

(8)

In the formula (8), $R^9$ independently represents a substituent selected from the group consisting of a hydrogen atom, an alkyl group having from 1 to 6 carbon atoms, an alkoxy group, norbornane, cyclohexane, tricyclodecane, adamantane, decalin and a bicyclooctyl group.

Crosslinking Agent

The composition for forming an underlayer film for lithography of the present invention may contain a crosslinking agent for suppressing intermixing from occurring.

Specific examples of the crosslinking agent that can be used in the present invention include a melamine compound, a guanamine compound, a glycoluril compound, a urea compound, an epoxy compound, a thioepoxy compound, an isocyanate compound, an azide compound, and a compound containing a double bond, such as an alkenyl ether group each of which are substituted with at least one group selected from a methylol group, an alkoxymethyl group and an acyloxymethyl group. These may be used as an additive, or in alternative, the crosslinking group may be introduced as a pendant group in the polymer side chain. A compound containing a hydroxyl group may also be used as a crosslinking agent.

Examples of the epoxy compound among the aforementioned compounds include tris(2,3-epoxypropyl)isocyanurate, trimethylolmethane triglycidyl ether, trimethylolpropane triglycidyl ether and triethylolethane triglycidyl ether. Examples of the melamine compound include hexamethylolmelamine, hexamethoxymethylmelamine, a compound obtained by methoxymethylating from 1 to 6 methylol groups of hexamethylolmelamine or a mixture thereof, hexamethoxyethylmelamine, hexaacyloxymethylmelamine, and a compound obtained by acyloxymethylating from 1 to 6 methylol groups of hexamethylolmelamine or a mixture thereof. Examples of the guanamine compound include tetramethylolguanamine, tetramethoxymethylguanamine, a compound obtained by methoxymethylating from 1 to 4 methylol groups of tetramethylolguanamine or a mixture thereof, tetramethoxyethylguanamine, tetraacyloxyguanamine, and a compound obtained by acyloxymethylating from 1 to 4 methylol groups of tetramethylolguanamine or a mixture thereof. Examples of the glycoluril compound include tetramethylolglycoluril, tetramethoxyglycoluril, tetramethoxymethylglycoluril, a compound obtained by methoxymethylating from 1 to 4 methylol groups of tetramethylolglycoluril or a mixture thereof, and a compound obtained by acyloxymethylating from 1 to 4 methylol groups of tetramethylolglycoluril or a mixture thereof. Examples of the urea compound include tetramethylolurea, tetramethoxymethylurea, a compound obtained by methoxymethylating from 1 to 4 methylol groups of tetramethylolurea, and tetramethoxyethylurea.

Examples of the compound containing an alkenyl ether group include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether and trimethyolpropane trivinyl ether.

As the crosslinking agent used in the present invention, the melamine compound substituted with at least one group selected from a methylol group, an alkoxymethyl group and an acyloxymethyl group is preferred among the aforementioned compound from the standpoint of the etching resistance and the heat resistance. The aforementioned crosslinking agents may be used solely or in combination of plural kinds thereof.

The amount of the crosslinking agent mixed in the present invention is preferably from 5 to 50 parts (parts by weight, hereinafter the same), and particularly preferably from 10 to 40 parts, per 100 parts of the polymer. In the case where the amount is less than 5 parts, there are some cases where it is mixed with the resist, and in the case where the amount exceeds 50 parts, there are some cases where the antireflection effect is lowered, and the film after crosslinking is cracked.

Acid Generating Agent

In the present invention, an acid generating agent may be added for accelerating the crosslinking reaction under heat. The acid generating agent includes one generating an acid through thermal decomposition and one generating an acid by light irradiation, and each of them may be added.

Examples of the acid generating agent that is used in the present invention include:

(1) an onium salt represented by the following general formula (P1a-1), (P1a-2), (P1a-3) or (P1b),
(2) a diazomethane derivative represented by the following general formula (P2),
(3) a glyoxime derivative represented by the following general formula (P3),
(4) a bissulfone derivative represented by the following general formula (P4),
(5) a sulfonate ester of an N-hydroxyimide compound represented by the following general formula (5),
(6) a β-ketosulfonic acid derivative,
(7) a disulfone derivative,
(8) a nitrobenzylsulfonate derivative, and
(9) a sulfonate ester derivative.

Acid Generating Agents (P1a-1), (P1a-2) and (P1a-3)

The acid generating agents represented by the general formulae (P1a-1), (P1a-2) and (P1a-3) are as follows.

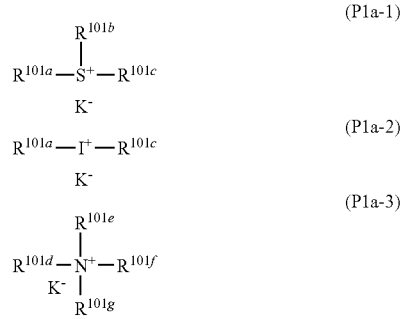

In the formulae (P1a-1), (P1a-2) and (P1a-3), $R^{101a}$, $R^{101b}$ and $R^{101c}$ each represent a linear, branched or cyclic alkyl group, alkenyl group, oxoalkyl group or oxoalkenyl group having from 1 to 12 carbon atoms, an aryl group having from 6 to 20 carbon atoms, or an aralkyl group or an aryloxoalkyl group, which has from 7 to 12 carbon atoms, in which a part or the whole of the hydrogen atoms of these groups may be replaced by an alkoxy group or the like. $R^{101b}$ and $R^{101c}$ may form a ring, and in the case where a ring is formed, $R^{101b}$ and $R^{101c}$ each represent an alkylene group having from 1 to 6 carbon atoms. K represents a non-nucleophilic counter ion. $R^{101d}$, $R^{101e}$, $R^{101f}$ and $R^{101g}$ each represent the group for $R^{101a}$, $R^{101b}$ and $R^{101c}$ or a hydrogen atom. $R^{101d}$ and $R^{101e}$, and $R^{101d}$, $R^{101e}$ and $R^{101f}$ each may form a ring, and in the case where a ring is formed, $R^{101d}$, $R^{101e}$, and $R^{101d}$, $R^{101e}$ and $R^{101f}$ each represent an alkylene group having from 3 to 10 carbon atoms. In alternative, they each represent a hetero aromatic ring containing the nitrogen atom in the formulae within the ring. $R^{101a}$, $R^{101b}$, $R^{101c}$, $R^{101d}$, $R^{101e}$, $R^{101f}$ and $R^{101g}$ may be the same as or different from each other.

Examples of the alkyl group having from 1 to 12 carbon atoms include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group and an adamantyl group. Examples of the alkenyl group include a vinyl group, an allyl group, a propenyl group, a butenyl group, a hexenyl group and a cyclohexenyl group. Examples of the oxoalkyl group include a 2-oxocyclopentyl group and a 2-oxocyclohexyl group, and also include a 2-oxopropyl group, a 2-cyclopentyl-2-oxoethyl group, a 2-cyclohexyl-2-oxoethyl group and a 2-(4-methylcyclohexyl)-2-oxoethyl group. Examples of the aryl group include a phenyl group, a naphthyl group, an alkoxyphenyl group, such as a p-methoxyphenyl group, a m-methoxyphenyl group, an o-methoxyphenyl group, an ethoxyphenyl group, a p-tert-butoxyphenyl group and a m-tert-butoxyphenyl group, an alkylphenyl group, such as a 2-methylphenyl group, a 3-methylphenyl group, a 4-methylphenyl group, an ethylphenyl group, a 4-tert-butylphenyl group, a 4-butylphenyl group and a dimethylphenyl group, an alkylnaphthyl group, such as a methoxynaphthyl group and an ethoxynaphthyl group, an alkoxynaphthyl group, such as a methoxynaphthyl group and an ethoxynaphthyl group, and a dialkoxynaphthyl group, such as a dimethoxynaphthyl group and a diethoxynaphthyl group. Examples of the aralkyl group include a benzyl group, a phenylethyl group and a phenethyl group. Examples of the aryloxoalkyl group include a 2-aryl-2-oxoethyl group, such as a 2-phenyl-2-oxoethyl group, a 2-(1-naphthyl)-2-oxoethyl group and a 2-(2-naphthyl)-2-oxoethyl group.

Examples of the non-nucleophilic counter ion represented by K include a halide ion, such as a chloride ion and a bromide ion, a fluoroalkylsulfonate, such as triflate, 1,1,1-trifluoroethanesulfonate and nonafluorobutanesulfonate, an arylsulfonate, such as tosylate, benzenesulfonate, 4-fluorobenzenesulfonate and 1,2,3,4,5-pentafluorobenzenesulfonate, andanalkylsulfonate, such as mesylate and butanesulfonate.

Examples of the complex aromatic ring containing the nitrogen atom in the ring represented by $R^{101d}$, $R^{101e}$, $R^{101f}$ and $R^{101g}$ include an imidazole derivative (such as imidazole, 4-methylimidazole and 4-methyl-2-phenylimidazole), a pyrazole derivative, a furazane derivative, a pyrroline derivative (such as pyrroline and 2-methyl-1-pyrroline), a pyrrolidine derivative (such as pyrrolidine, N-methylpyrrolidine, pyrrolidinone and N-methylpyrrolidone), an imidazoline derivative, an imidazolidine derivative, a pyridine derivative (such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine and dimethylaminopyridine), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (such as quinoline and 3-quinolinecarbonitrile), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, an uracil derivative, and an uridine derivative.

The general formula (P1a-1) and the general formula (P1a-2) have both effects of a photoacid generating agent and a thermal acid generating agent, and the general formula (P1a-3) functions as a thermal acid generating agent.

Acid Generating Agent (P1b)

An acid generating agent represented by the formula (P1b) is as follows.

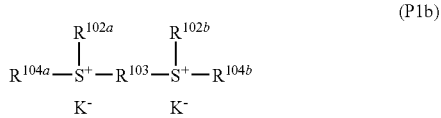

(P1b)

In the formula, $R^{101a}$ and $R^{101b}$ each represent a linear, branched or cyclic alkyl group having from 1 to 8 carbon atoms. $R^{103}$ represents a linear, branched or cyclic alkylene group having from 1 to 10 carbon atoms. $R^{104a}$ and $R^{104b}$ each represent a 2-oxoalkyl group having from 3 to 7 carbon atoms. K represents a non-nucleophilic counter ion.

Examples of the alkyl group represented by $R^{102a}$ and $R^{102b}$ include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cyclopropylmethyl group, a 4-methylcyclohexyl group and a cyclohexylmethyl group. Examples of the alkylene group having from 1 to 10 carbon atoms represented by $R^{103}$ include a methylene group, an ethylene group, a propylene group, a butylene group, a pentylene group, a hexylene group, a heptylene group, an octylene group, a nonylene group, a 1,4-cyclohexylene group, a 1,2-cyclohexylene group, a 1,3-cyclopentylene group, a 1,4-cyclooctylene group and a 1,4-cyclohexanedimethylene group. Examples of $R^{104a}$ and $R^{104b}$ include a 2-oxopropyl group, a 2-oxocyclopentyl group, a 2-oxocyclohexyl group and a 2-oxocycloheptyl group. Examples of K include the same ones as having been described for the formulae (P1a-1), (P1a-2) and (P1a-3).

Acid Generating Agent (P2)

An acid generating agent represented by the general formula (P2) is as follows.

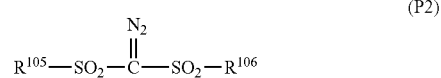

(P2)

In the formula (P2), $R^{105}$ and $R^{106}$ each represent a linear, branched or cyclic alkyl group or halogenated alkyl group having from 1 to 12 carbon atoms, an aryl group or halogenated aryl group having from 6 to 20 carbon atoms, or an aralkyl group having from 7 to 12 carbon atoms.

Examples of the alkyl group having from 1 to 12 carbon atoms represented by $R^{105}$ and $R^{106}$ include a methyl group, an ethyl group, a propyl group, an isopropyl group, a n-butyl group, a sec-butyl group, a tert-butyl group, a pentyl group, a hexyl group, a heptyl group, an octyl group, an amyl group, a cyclopentyl group, a cyclohexyl group, a cycloheptyl group, a norbornyl group and an adamantyl group. Examples of the halogenated alkyl group include a trifluoromethyl group, a 1,1,1-trifluoroethyl group, a 1,1,1-trichloroethyl group and a nonafluorobutyl group. Examples of the aryl group include a phenyl group, an alkoxyphenyl group, such as a p-methoxyphenyl group, a m-methoxyphenyl group, an o-methoxyphenyl group, an ethoxyphenyl group, a p-tert-butoxyphenyl group and a m-tert-butoxyphenyl group, and an alkylphenyl group, such as a 2-methylphenyl group, a 3-methylphenyl group, a 4-methylphenyl group an ethylphenyl group, a 4-tert-butylphenyl group, a 4-butylphenyl group and a dimethylphenyl group. Examples of the halogenated aryl group include a fluorophenyl group, a chlorophenyl group and a 1,2,3,4,5-pentafluorophenyl group. Examples of the aralkyl group include a benzyl group and a phenethyl group.

Acid Generating Agent (P3)

An acid generating agent represented by the general formula (P3) is as follows.

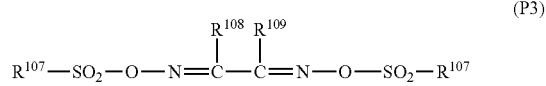

(P3)

In the formula (P3), $R^{107}$, $R^{108}$ and $R^{109}$ each represent a linear, branched or cyclic alkyl group or halogenated alkyl group having from 1 to 12 carbon atoms, an aryl group or halogenated aryl group having from 6 to 20 carbon atoms, or an aralkyl group having from 7 to 12 carbon atoms. $R^{108}$ and $R^{109}$ may be bonded to each other to form a cyclic structure. In the case where a cyclic structure is formed, $R^{108}$ and $R^{109}$ each represent a linear or branched alkylene group having from 1 to 6 carbon atoms.

Examples of the alkyl group, the halogenated alkyl group, the aryl group, the halogenated aryl group and the aralkyl group represented by $R^{107}$, $R^{108}$ and $R^{109}$ include the same ones as described for $R^{105}$ and $R^{106}$. Examples of the alkylene group represented by $R^{108}$ and $R^{109}$ include a methylene group, an ethylene group, a propylene group, a butylene group and a hexylene group.

Acid Generating Agent (P4)

An acid generating agent represented by the general formula (P4) is as follows.

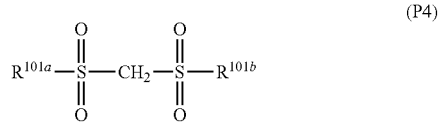

(P4)

In the formula (P4), $R^{101a}$ and $R^{101b}$ have the same meanings as above.

Acid Generating Agent (P5)

An acid generating agent represented by the general formula (P5) is as follows.

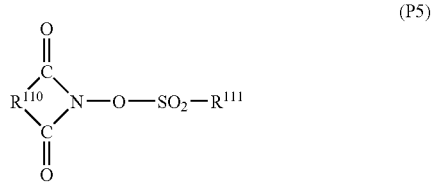

(P5)

In the formula (P5), $R^{110}$ represents an arylene group having from 6 to 10 carbon atoms, an alkylene group having from 1 to 6 carbon atoms or an alkenylene group having from 2 to 6 carbon atoms, in which a part or the whole of the hydrogen atoms in the groups may be substituted by a linear or branched alkyl group or alkoxy group having from 1 to 4 carbon atoms, a nitro group, an acetyl group or a phenyl group, $R^{111}$ represents a linear, branched or substituted alkyl group, alkenyl group or alkoxyalkyl group having from 1 to 8 carbon atoms, a phenyl group or a naphthyl group, in which a part or the whole of the hydrogen atoms in the groups may be substituted by an alkyl group or alkoxy group having from 1 to 4 carbon atoms, a phenyl group, which may be substituted by an alkyl group having from 1 to 4 carbon atoms, an alkoxy group, a nitro group or an acetyl group, a heterocyclic aromatic group having from 3 to 5 carbon atoms, a chlorine atom or a fluorine atom.

Examples of the arylene group represented by $R^{110}$ include a 1,2-phenylene group and a 1,8-naphthylene group, examples of the alkylene group therefor include a methylene group, an ethylene group, a trimethylene group, a tetramethylene group, a phenylethylene group and a nobornan-2,3-diyl group, and examples of the alkenylene group therefor include a 1,2-vinylene group, a 1-phenyl-1,2-vinylene group and a 5-norbornen-2,3-diyl group. Examples of the alkyl group represented by $R^{111}$ include the same ones as in $R^{101a}$ to $R^{101c}$, examples of the alkenyl group therefor include a vinyl group, a 1-propenyl group, an allyl group, a 1-butenyl group, a 3-butenyl group, an isoprenyl group, a 1-pentenyl group, a 3-pentenyl group, a 4-pentenyl group, a dimethylallyl group, a 1-hexenyl group, a 3-hexenyl group, a 5-hexenyl group, a 1-heptenyl group, a 3-heptenyl group, a 6-heptenyl group and a 7-octenyl group, examples of the alkoxyalkyl group therefor include a methoxymethyl group, an ethoxyethyl group, a propoxymethyl group, a butoxymethyl group, a pentyloxymethyl group, a hexyloxymethyl group, a heptyloxymethyl group, a methoxyethyl group, an ethoxyethyl group, a propoxyethyl group, a butoxyethyl group, a penthyoxyethyl group, a hexyloxyethyl group, a methoxypropyl group, an ethoxypropyl group, a propoxypropyl group, a butoxypropyl group, a methoxybutyl group, an ethoxybutyl group, a propoxybutyl group, a methoxypentyl group, an ethoxypentyl group, a methoxyhexyl group and a methoxyheptyl group.

Examples of the alkyl group having from 1 to 4 carbon atoms, which may be substituted, include a methyl group, an ethyl group, a propyl group, an isopropyl group, a n-butyl group, an isobutyl group and a tert-butyl group, examples of the alkoxy group having from 1 to 4 carbon atoms include a methoxy group, an ethoxy group, a propoxy group, an isopropoxy group, a n-butoxy group, an isobutoxy group and a tert-butoxy group, examples of the phenyl group, which may be substituted by an alkyl group having from 1 to 4 carbon atoms, an alkoxy group, a nitro group or an acetyl group, include a phenyl group, a tolyl group, a p-tert-butoxyphenyl group, a p-acetylphenyl group and a p-nitrophenyl group, and examples of the heterocyclic aromatic group having from 3 to 5 carbon atoms include a pyridyl group and a furyl group.

Specific examples of the acid generating agent represented by the general formula (P5) include: an onium salt, such as tetramethylammonium trifluoromethanesulfonate, tetramethylammonium nonafluorobutanesulfonate, triethylammonium nonafluorobutanesulfonate, pyridinium nonafluorobutanesulfonate, triethylammonium camphorsulfonate, pyridinium camphorsulfonate, tetra-n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis(methyl(2-oxocyclopentyl)sulfonium trifluoromethanesulfonate) and 1,2'-naphthylcarbonylmethyltetrahydrothophenium triflate;

a diazomethane derivative, such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane and 1-tert-amylsulfonyl-1-(tert-butylsulfonyl)diazomethane;

a glyoxime derivative, such as bis(p-toluenesulfonyl)-α-dimethylglyoxime, bis(p-toluenesulfonyl)-α-diphenylglyoxime, bis(p-toluenesulfonyl)-α-dicyclohexylglyoxime, bis(p-toluenesulfonyl)-2,3-pentandioneglyoxime, bis(p-toluenesulfonyl)-2-methyl-3,4-pentandioneglyoxime, bis(n-butanesulfonyl)-α-dimethylglyoxime, bis(n-butanesulfonyl)-α-diphenylglyoxime, bis(n-butanesulfonyl)-α-dicyclohexylglyoxime, bis(n-butanesulfonyl)-2,3-pentandioneglyoxime, bis(n-butanesulfonyl)-2-methyl-3,4-pentandioneglyoxime, bis(methanesulfonyl)-α-dimethylglyoxime, bis(trifluoromethanesulfonyl)-α-dimethylglyoxime, bis(1,1,1-trifluoroethanesulfonyl)-α-dimethylglyoxime, bis(tert-butanesulfonyl)-α-dimethylglyoxime, bis(perfluorooctanesulfonyl)-α-dimethylglyoxime, bis(cyclohexanesulfonyl)-α-dimethylglyoxime, bis(benzenesulfonyl)-α-dimethylglyoxime, bis(p-fluorobenzenesulfonyl)-α-dimethylglyoxime, bis(p-tert-butylbenzenesulfonyl)-α-dimethylglyoxime, bis(xylenesulfonyl)-α-dimethylglyoxime and bis(camphorsulfonyl)-α-dimethylglyoxime;

a bissulfone derivative, such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane and bisbenzenesulfonylmethane;

β-Ketosulfonic Acid Derivative a β-ketosulfonic acid derivative, such as 2-cyclohexylcarbonyl-2-(p-toluenesulfonyl)propane and 2-isopropylcarbonyl-2-(p-toluenesulfonyl)propane;

Disulfone Derivative a disulfone derivative, such as a diphenylsulfone derivative and a dicyclohexyldisulfone derivative;

Nitrobenzyl Sulfonate Derivative a nitrobenzyl sulfonate derivative, such as 2,6-dinitrobenzyl p-toluenesulfonate and 2,4-dinitrobenzyl p-toluenesulfonate;

Sulfonate Ester Derivative a sulfonate ester derivative, such as 1,2,3-tris(methanesulfonyloxy)benzene, 1,2,3-tris(trifluoromethanesulfonyloxy)benzene and 1,2,3-tris(p-toluenesulfonyloxy)benzene;

sulfonate ester derivative of an N-hydroxyimide compound, such as N-hydroxysuccinimide methanesulfonate ester, N-hydroxysuccinimide trifluoromethanesulfonate ester, N-hydroxysuccinimide ethanesulfonate ester, N-hydroxysuccinimide 1-propanesulfonate ester, N-hydroxysuccinimide 2-propanesulfonate ester, N-hydroxysuccinimide 1-pentanesulfonate ester, N-hydroxysuccinimide 1-octanesulfonate ester, N-hydroxysuccinimide p-toluenesulfonate ester, N-hydroxysuccinimide p-methoxybenzenesulfonate ester, N-hydroxysuccinimide 2-chloroethanesulfonate ester, N-hydroxysuccinimide benzenesulfonate ester, N-hydroxysuccinimide-2,4,6-trimethylbenzenesulfonate ester, N-hydroxysuccinimide 1-naphthalenesulfonate ester, N-hydroxysuccinimide 2-naphthalenesulfonate ester, N-hydroxy-2-phenylsuccinimide methanesulfonate ester, N-hydroxymaleimide methanesulfonate ester, N-hydroxymaleimide ethanesulfonate ester, N-hydroxy-2-phenylmaleimide methanesulfonate ester, N-hydroxyglutarimide methanesulfonate ester, N-hydroxyglutarimide benzenesulfonate ester, N-hydroxyphthalimide methanesulfonate ester, N-hydroxyphthalimide benzenesulfonate ester, N-hydroxyphthalimide trifluoromethanesulfonate ester, N-hydroxyphthalimide p-toluenesulfonate ester, N-hydroxynaphthalimide methanesulfonate ester, N-hydroxynaphthalimide benzenesulfonate ester, N-hydroxy-5-norbornene-2,3-dicarboxylmide methanesulfonate ester, N-hydroxy-5-norbornene-2,3-dicarboxylmide trifluoromethanesulfonate ester and N-hydroxy-5-norbornene-2,3-dicarboxylmide p-toluenesulfonate ester, and in particular, examples thereof that are preferably used include: an onium salt, such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate and 1,2'-naphthylcarbonylmethyltetrahydrothophenium triflate; a diazomethane derivative, such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane and bis(tert-butylsulfonyl)diazomethane; a glyoxime derivative, such as bis(p-toluenesulfonyl)-α-dimethylglyoxime and bis(n-butanesulfonyl)-α-dimethylglyoxime; a bissulfone derivative, such as bisnaphthylsulfonylmethane; and a sulfonate ester derivative of an N-hydroxyimide compound, such as N-hydroxysuccinimide methanesulfonate ester, N-hydroxysuccinimide trifluoromethanesulfonate ester, N-hydroxysuccinimide 1-propanesulfomate ester, N-hydroxysuccinimide 2-propanesulfonate ester, N-hydroxysuccinimide 1-pentanesulfonate ester, N-hydroxysuccinimide p-toluenesulfonate ester, N-hydroxynaphthalimide methanesulfonate ester and N-hydroxynaphthalimide benzenesulfonate ester.

The acid generating agent may be used solely or in combination of two or more kinds thereof. The amount of the acid generating agent added is preferably from 0.1 to 50 parts, and more preferably from 0.5 to 40 parts, per 100 parts of the polymer. In the case where the amount is less than 0.1 part, there are cases where the amount of an acid generated is small to make the crosslinking reaction insufficient, and in the case where it exceeds 50 parts, there are cases where the acid migrates to the upper layer resist to cause the mixing phenomenon.

Basic Compound

The composition for forming an underlayer film for lithography of the present invention may contain a basic compound for enhancing the storage stability. The basic compound functions as a quencher of an acid, by which the crosslinking reaction is prevented from proceeding by an acid formed in a minute amount from the acid generating agent. Examples of the basic compound include a primary, secondary or tertiary aliphatic amine compound, a mixed amine compound, an aromatic amine compound, a heterocyclic amine compound, a nitrogen-containing compound having a carboxyl group, a nitrogen-containing compound having a sulfonyl group, a nitrogen-containing compound having a hydroxyl group, a nitrogen-containing compound having a hydroxyphenyl group, an alcoholic nitrogen-containing compound, an amide derivative and an imide derivative.

Specifically, examples of the primary aliphatic amine compound include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine and tetramethylenepentamine, examples of the secondary aliphatic amine compound include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine and N,N-dimethyltetraethylenepentamine, examples of the tertiary aliphaticamine compound include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine and N,N,N',N'-tetramethyltetraethylenepentamine.

Examples of the mixed amine compound include dimethyldiethylamine, methylethylpropylamine, benzylamine, phenethylamine and benzyldimethylamine. Examples of the aromatic amine compound and the heterocyclic amine compound include an aniline derivative (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline and N,N-dimethyltoluidine), diphenyl(p-tolyl)amine, methyldiphenylamine, triphenylamine, phenylenediamine, naphthylamine, diaminonaphthalene, a pyrrole derivative (such as pyrrole, 2H-pyrrole, 1-methylpyrrole, 2,4-dimethylpyrrole, 2,5-dimethylpyrrole and N-methylpyrrole), an oxazole derivative (such as oxazole and isooxazole), a thiazole derivative (such as thiazole and isothiazole), an imidazole derivative (such as imidazole, 4-methylimidazole and 4-methyl-2-phenylimidazole), a pyrazole derivative, a furazane derivative, a pyrroline derivative (such as pyrroline and 2-methyl-1-pyrroline), a pyrrolidine derivative (such as pyrrolidine, N-methylpyrrolidine, pyrrolidinone and N-methylpyrrolidone), an imidazoline derivative, an imidazolidine derivative, a pyridine derivative (such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine and dimethylaminopyridine), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (such as quinoline and 3-quinolinecarbonitrile), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, an uracil derivative and an uridine derivative.

Examples of the nitrogen-containing compound having a carboxyl group include aminobenzoic acid, indolecarboxylic acid and an amino acid derivative (such as nicotinic acid, alanine, arginine, asparaginic acid, glutamic acid, glycine, histidine, isoleucine, glycylleucine, leucine, methionine, phenylalanine, threonine, lysine, 3-aminopyrazine-2-carboxylic acid and methoxyalanine), examples of the nitrogen-containing compound having a sulfonyl group include 3-pyridinesulfonic acid and pyridinium p-toluenesulfonate, and examples of the nitrogen-containing compound having a hydroxyl group, the nitrogen-containing compound having a hydroxyphenyl group and the alcoholic nitrogen-containing compound include 2-hydroxypyridine, aminocresol, 2,4-quinolinediol, 3-indolemethnanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-(2-(2-hydroxyethoxy)ethyl)piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide and N-(2-hydroxyethyl)isonicotinamide. Examples of the amide derivative include formamide, N-methylformamide, N,N-dimethylformamide, acetamide, N-methylacetamide, N,N-dimethylacetamide, propionamide and benzamide. Examples of the imide derivative include phthalimide, succinimide and maleimide.

The amount of the basic compound mixed is preferably from 0.001 to 2 part, and particularly from 0.01 to 1 part, per 100 parts of the polymer. In the case where the amount is less than 0.001 part, the effect of the addition cannot be obtained, and in the case where it exceeds 2 parts, there are cases where the entire acid generated under heat is trapped to fail to perform crosslinking.

Cyanate Compound

The composition for forming an underlayer film for lithography of the present invention may preferably contain a cyanate compound represented by the following general formulae (13) and (14) for the purpose of enhancing the heat resistance and etching resistance.

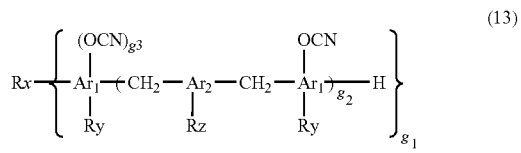

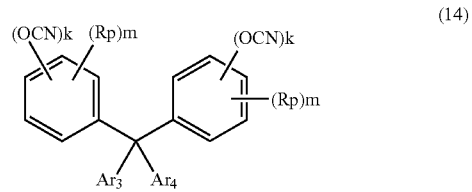

In the formulae, Rx represents a group selected from the group consisting of an aryl group, a hydrocarbon group having from 1 to 4 carbon atoms, a hydrogen atom and a single bond, and examples of the hydrocarbon group include the hydrocarbon groups described for $R^2$ that each have from 1 to 4 carbon atoms. Ry and Rp each independently represent a hydrogen atom, an alkyl group or an aryl group, and Rz represents a hydrogen atom, an alkyl group or an aryl group. Plural groups represented by each of Rp, Ry and Rz may be the same as or different from each other. $Ar_2$, $Ar_3$ and $Ar_4$ each independently represent a phenylene group, a naphthylene group or a biphenylene group, in which in the case where $Ar_2$ represents a phenylene group, $Ar_1$ represents a naphthylene group or a biphenylene group, and in the case where $Ar_2$ represents a naphthylene group or a biphenylene group, $Ar_1$ represents a phenylene group, a naphthylene group or a biphenylene group. $Ar_3$ and $Ar_4$ may be bonded to each other through a single bond or directly by the aromatic rings themselves. For example, in the case where $Ar_3$ and $Ar_4$ each represent a phenyl group and are bonded to each other through a single bond, a fluorenone structure is formed, and in the case where the phenyl groups are bonded directly to each other, an acenaphthene structure is formed. $g_1$ represents an integer of from 1 to 5, $g_2$ represents an integer of from 0 to 50, and $g_3$ represents an integer of from 1 to 3. k represents an integer of from 1 to 5, and m represents an integer of from 0 to 4, provided that $1 \leq k+m \leq 5$.

The composition for forming an underlayer film for lithography of the present invention may preferably contain a cyanate compound represented by the following general formula (15).

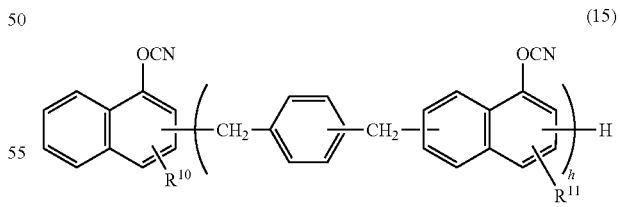

In the formula (15), $R^{10}$ and $R^{11}$ each independently represent a hydrogen atom or an alkyl group, and plural groups represented by $R^{11}$ may be the same as or different from each other. h represents an integer of from 1 to 50.

Other Components

The composition for forming an underlayer film for lithography of the present invention may contain other resin and/or compound for the purposes of imparting thermosetting property and controlling the light absorbance. A naphthol resin having high transparency at 193 nm, a naphthalenediol resin, a naphthol-modified xylene resin, a phenol-modified naphthalene resin, polyhydroxystyrene, a dicyclopentadiene resin, a resin containing (meth)acrylate, dimethacrylate, trimethacrylate, tetramethacrylate, a naphthalene ring, such as vinylnaphthalene and polyacenaphthylene, a heterocyclic ring having a hetero atom, such as thiophene and indene, a resin not containing an aromatic ring, a rosin resin, and a resin or a compound containing an alicyclic structure, such as cyclodextrin, adamantane (poly)ol, tricyclodecane (poly)ol and derivatives thereof.

The composition for forming an underlayer film for lithography of the present invention may contain metallic particles, such as titanium oxide, and inorganic particles, such as fullerene, having an average particle diameter that does not exceeds 1 micron. By adding the metallic particles or the inorganic particles, the dry etching rate can be lowered, and the selective ratio to the photoresist can be increased.

Organic Solvent

The organic solvent that can be used in the composition for forming an underlayer film for lithography of the present invention is not particularly limited as far as it dissolves the polymer, the polyphenol compound, the cyclic organic compound, the acid generating agent, the crosslinking agent, the other additives and the like.

Examples of the solvent include a ketone solvent, such as acetone, methyl ethyl ketone, methyl isobutyl ketone and cyclohexanone, a cellosolve solvent, such as propylene glycol monomethyl ether and propylene glycol monomethyl ether acetate, an ester solvent, such as ethyl lactate, methyl acetate, ethyl acetate, butyl acetate, isoamyl acetate, ethyl lactate, methyl methoxypropionate and methyl hydroxyisobutyrate, an alcohol solvent, such as methanol, ethanol, isopropanol and 1-ethoxy-2-propanol, an aromatic hydrocarbon, such as toluene, xylene and anisole.

Among the organic solvents, cyclohexanone, propylene glycol monomethyl ether, propylene glycol monomethyl ether acetate, ethyl lactate, methyl hydroxyisobutyrate and anisole are particularly preferred.

The amount of the organic solvent mixed is preferably from 200 to 10,000 parts, and particularly from 300 to 5,000 parts, per 100 parts of the polymer.

Method for Forming Underlayer Film for Lithography and Multi-layer Resist Pattern Method for Forming Underlayer Film The formation of an underlayer film using the composition for forming an underlayer film for lithography of the present invention is performed preferably in such a manner that the composition is spin-coated, from which the organic solvent is then evaporated, and baked to accelerate the crosslinking reaction for preventing mixing with the upper layer resist. The baking temperature is preferably in a range of from 80 to 500° C., and particularly from 200 to 300° C., and the baking time is preferably in a range of from 10 to 300 seconds. The thickness of the underlayer film may be appropriately selected, and is preferably from 30 to 20,000 nm, and particularly from 50 to 15,000 nm. After producing the underlayer film, a silicon-containing resist layer or an ordinary single layer resist formed of a hydrocarbon is formed thereon in the case of the two-layer process, or a silicon-containing intermediate layer is formed thereon, and a single layer resist layer containing no silicon is further formed thereon in the case of the three-layer process.

In these cases, a photoresist composition for forming the resist layer may be a heretofore known one.

In view of oxygen gas etching resistance, the silicon-containing resist composition used for the two-layer process may be a positive photoresist composition using a silicon atom-containing polymer, such as a polysilsesquioxane derivative or a vinylsilane derivative, as a base polymer, and further containing an organic solvent, an acid generating agent, and a basic compound and the like depending on necessity. The silicon atom-containing polymer may be a heretofore known polymer that is used for a resist composition of this type.

The silicon-containing intermediate layer used for the three-layer process is preferably a polysilsesquioxane-based intermediate layer. Reflection can be suppressed by imparting an effect of an antireflection layer to the intermediate layer.

A material containing a large amount of aromatic groups and having high substrate etching resistance is used as the underlayer film for exposure to light at 193 nm, the k value increases and the substrate reflection increases, but the substrate reflection can be decreased to 0.5% or less by suppressing reflection by the intermediate layer.

The intermediate layer having an antireflection effect for exposure to light at 193 nm is preferably polysilsesquioxane having a phenyl group or a light absorbing group having a silicon-silicon bond introduced thereto and being crosslinked with an acid or heat, but is not limited thereto.

An intermediate layer formed by a chemical vapor deposition (CVD) method may also be used. The known intermediate layer produced by the CVD method that exhibits high effect as an antireflection film includes an SiON film. The formation of the intermediate layer by the spin coating method is convenient and advantageous in cost as compared to the CVD method. The upper layer resist in the three-layer process may be either a positive type or a negative type, and may be the same one as a single layer resist that is ordinarily employed.

The underlayer film of the present invention may also be used as an antireflection film for the ordinary single layer resist. The underlayer film of the present invention is excellent in etching resistance for the ground process and thus can be expected to have a function of a hardmask for the ground process.

Method for forming Multi-layer Resist Pattern

In the case where a resist layer is formed with the aforementioned photoresist composition, a spin coating method is preferably employed as similar to the case of forming the underlayer film. After spin-coating the resist composition, the coated composition is pre-baked, for which ranges of from to 180° C. and from 10 to 300 seconds are preferred. Thereafter, exposure to light is performed by an ordinary method, and post-exposure baking (PEB) and development are performed to provide a resist pattern. The thickness of the resist film is not particularly limited, and is preferably from 30 to 500 nm, and particularly from 50 to 400 nm.

Examples of the light for exposure include a high energy ray having a wavelength of 300 nm or less, specific examples of which include excimer laser of 248 nm, 193 nm or 157 nm, a soft X-ray of from 3 to 20 nm, an electron beam, and an X-ray.

Etching is then performed with the resulting resist pattern as a mask. Etching of the underlayer film in the two-layer process is performed by etching using an oxygen gas. In addition to an oxygen gas, an inert gas, such as He and Ar, or such a gas as CO, $CO_2$, $NH_3$, $SO_2$, $N_2$, $NO_2$ or $H_2$ may be added, and the etching may be performed by using CO, $CO_2$, $NH_3$, $N_2$, $NO_2$ or $H_2$ gas without the use of an oxygen gas. In particular, the later gas is used for protecting the side wall of the pattern for preventing undercut of the side wall. Etching of the intermediate layer in the three-layer process is performed by processing the intermediate layer using a freon series gas with the resist pattern as a mask. Subsequently, the aforementioned etching with an oxygen gas is performed to process the underlayer film with the intermediate layer pattern as a mask.

Etching of the substrate to be processed can be performed by an ordinary method, and for example, etching with a freon series gas is performed for a substrate of $SiO_2$ or SiN, and etching with a chlorine series or bromine series gas is performed for a substrate of p-Si, Al or W. In the case where the substrate is etched with a freon series gas, the silicon-containing resist in the two-layer resist process or the silicon-containing intermediate layer in the three-layer process are peeled off simultaneously with the processing of the substrate. In the case where the substrate is etched with a chlorine series or bromine series gas, the silicon-containing resist layer or the silicon-containing intermediate layer is necessarily peeled off separately by dry etching with a freon series gas after processing the substrate.

The underlayer film of the present invention has, as a characteristic feature, excellent resistance to etching of the substrate to be processed.

The substrate to be processed is formed on a substrate. The substrate is not particularly limited, and one formed of a different material from the film to be processed (substrate to be processed), for example, Si, α-Si, p-Si, $SiO_2$, SiN, SiON, W, TiN and Al. As the film to be processed, various kinds of low k film, such as Si, $SiO_2$, SiON, SiN, p-Si, α-Si, W, W—Si, Al, Cu and Al—Si, and a stopper film therefor, which may be generally formed to have a thickness of from 50 to 10,000 nm, and particularly from 100 to 5,000 nm.

EXAMPLE

The present invention will be specifically described with reference to synthesis examples, examples and comparative examples below, but the present invention is not limited to the description. The molecular weight was measured specifically in the following manner. A weight average molecular weight (Mw) and a number average molecular weight (Mn) of polystyrene conversion were measured by gel permeation chromatography (GPC), and a dispersion degree (Mw/Mn) was obtained. A weight reduction rate upon increasing the temperature from 40° C. to 400° C. at 10° C. per minute was measured with a calorimeter (TGA).

(1) Synthesis Example of DMN Resin (1,5-DMN-R)

1,5-Dimethylnaphthalene (1,5-DMN), produced by Mitsubishi Gas Chemical Co., Inc., (218 g, 1.4 mol), a 40% formalin aqueous solution, produced by Mitsubishi Gas Chemical Co., Inc., (420 g, 5.6 mol) and 98% sulfuric acid, produced by Kanto Kagaku Co., Ltd., (194 g) were charged under a nitrogen stream into a four-neck flask (2 L) equipped with a Dimroth condenser, a thermometer and a stirring blade, and were refluxed under ordinary pressure at 100° C. for 7 hours. After diluting with ethylbenzene, the reaction mixture was neutralized and rinsed with water, and the solvent and 1,5-DMN were removed under reduced pressure to provide 250 g of a light brown solid matter (1,5-DMN-R). As a result of GPC measurement, Mn was 550, Mw was 1,130, and Mw/Mn was 2.05.

(2) Synthesis Example of Naphthol Derivative 1

Ethyl tricyclodecanecarboxylate ester (TCDE), produced by Mitsubishi Gas Chemical Co., Inc., (416 g, 2 mol), α-naphthol, produced by Sugai Chemical Industry, Co., Ltd., (144 g, 1 mol) and p-toluenesulfonic acid (41 g, 0.24 mol) were charged under a nitrogen stream into a four-neck flask (2 L) equipped with a Dimroth condenser, a thermometer and a stirring blade, and were refluxed under ordinary pressure while distilling off the distillate at 200° C. for 4 hours. After diluting with a solvent, the reaction mixture was neutralized and rinsed with water, and distilled to provide 295 g of a naphthol derivative containing isomers (which may be hereinafter referred to as NPT-TCD). The ratio of isomers was (naphthol derivative 1)/(naphthol derivative 2)=65/35.

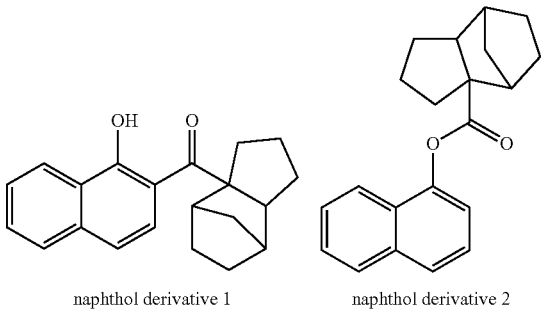

naphthol derivative 1     naphthol derivative 2

(3) Synthesis Example of Naphthol Derivative 2

110.8 g of HF was charged under cooling into a 500 cc reactor made of Hastelloy, and after increasing the pressure with CO to 2 MPa while maintaining the liquid temperature to 30° C. or less under stirring the content, 82.0 g of dihydrodicyclopentadiene diluted with 54.7 g of heptane was added thereto. After maintaining the liquid temperature to 30° C. for 20 hours, a part of the content (a carbonylation reaction solution) was sampled into iced water, and the oily layer obtained by neutralizing was analyzed by gas chromatography (yield of the carbonylation reaction product: 55.0% by mol).

Subsequently, 52.8 g of α-naphthol and 53.3 g of heptane were charged in a 1 L reactor made of stainless steel, and after cooling to −15° C., the carbonylation reaction solution having been synthesized was fed from the upper part of the reactor (fed under pressure by connecting a tube). After maintaining −18° C. for 30 minutes, a part of the content was sampled into iced water, and the oily layer obtained by neutralizing was analyzed by gas chromatography. Furthermore, after maintaining the temperature to 0° C. for 25 hours, the whole content was collected and placed into iced water, and the oily layer obtained by neutralizing was analyzed by gas chromatography. The ratio of isomers of the naphthol derivatives in the oily layer was (naphthol derivative 1)/(naphthol derivative 2)=97/3.

(3) Synthesis Example 1 of Modified Resin NF-1

1,5-DMN-R (90 g, 0.5 mol), α-naphthol (71.1 g, 0.49 mol) and p-toluenesulfonic acid (0.024 g) were charged under a nitrogen stream into a four-neck flask (0.5 L) equipped with a Dimroth condenser, a thermometer and a stirring blade, and were reacted by increasing the temperature to 185° C. for 4 hours. After diluting with a solvent, the reaction mixture was neutralized and rinsed with water, and the solvent and α-naphthol were removed under reduced pressure to provide 160 g of a light brown solid matter (NF-1). As a result of GPC measurement, Mn was 848, Mw was 1,630 and Mw/Mn was 1.93, and the hydroxyl value was 175 mgKOH/g. The weight reduction rate at 400° C. was 21%.

(4) Synthesis Example 2 of Modified Resin NF-2

The same synthesis procedures as in Synthesis Example 1 were carried out except that the charged ratio of 1,5-DMN-R and α-naphthol was changed to 7/3 to provide 160 g of a light brown solid matter (NF-2). As a result of GPC measurement, Mn was 823, Mw was 2,640 and Mw/Mn was 3.21, and a hydroxyl value was 96 mgKOH/g.

(5) Synthesis Example 3 of Modified Resin NF-3

The same synthesis procedures as in Synthesis Example 1 were carried out except that the charged ratio of 1,5-DMN-R and α-naphthol was changed to 5/1, and p-toluenesulfonic acid was added in an amount of 10 ppm with respect to the solid content to provide 160 g of a brown solid matter (NF-3). As a result of GPC measurement, Mn was 711, Mw was 2,113 and Mw/Mn was 2.97, and the hydroxyl value was 52 mgKOH/g.

(6) Synthesis Example 4 of Modified Resin NF-4

The same synthesis procedures as in Synthesis Example 1 were carried out except that the charged ratio of 1,5-DMN-R and α-naphthol was changed to 1/0, and p-toluenesulfonic acid was added in an amount of 50 ppm with respect to the solid content to provide 160 g of a brown solid matter (NF-4). As a result of GPC measurement, Mn was 839, Mw was 5,428 and Mw/Mn was 6.47, and the hydroxyl value was 3 mgKOH/g. The weight reduction rate at 400° C. was 23%.

(7) Synthesis Example 5 of Modified Resin NF-5

The same synthesis procedures as in Synthesis Example 1 were carried out except that NTP-TCD was used instead of α-naphthol, the charged ratio to 1,5-DMN-R was changed to 1/1, and the reaction temperature was changed to 165° C. to provide NF-5. As a result of GPC measurement, Mn was 660, Mw was 2,090 and Mw/Mn was 3.16.

(8) Synthesis Example 6 of Modified Resin NF-6

The same synthesis procedures as in Synthesis Example 1 were carried out except that NTP-TCD was used instead of α-naphthol, and the charged ratio to 1,5-DMN-R was changed to 7/3 to provide NF-6. As a result of GPC measurement, Mn was 831, Mw was 6,900 and Mw/Mn was 8.3. The weight reduction rate at 400° C. was 20%.

(9) Synthesis Example 7 of Modified Resin NF-7

The same synthesis procedures as in Synthesis Example were carried out except that the charged ratio of 1,5-DMN-R/NPT-TCD/α-naphthol was changed to 6/2/2 to provide NF-7. As a result of GPC measurement, Mn was 911, Mw was 8,100 and Mw/Mn was 8.9.

(10) Synthesis Example 8 of Modified Resin NF-8

The same synthesis procedures as in Synthesis Example were carried out except that the charged ratio of 1,5-DMN-R/NPT-TCD/α-naphthol was changed to 6/2/2 to provide NF-8. As a result of GPC measurement, Mn was 911, Mw was 8,100 and Mw/Mn was 8.9.

(11) Synthesis Example 9 of Modified Resin NF-9

The same synthesis procedures as in Synthesis Example 1 were carried out except that acenaphthene (ACN) was used instead of α-naphthol, and the charged ratio to 1,5-DMN-R was changed to 2/1 to provide NF-9. As a result of GPC measurement, Mn was 584, Mw was 1,669 and Mw/Mn was 2.86. The weight reduction rate at 400° C. was 17%, which showed that the amount of the sublimable components was small.

(12) Synthesis Example 10 of Modified Resin NF-10

The same synthesis procedures as in Synthesis Example were carried out except that the charged ratio of 1,5-DMN-R/ACN/α-naphthol was changed to 10/3/3 to provide NF-10. As a result of GPC measurement, Mn was 911, Mw was 8,100 and Mw/Mn was 8.9. The weight reduction rate at 400° C. was 17%, which showed that the amount of the sublimable components was small.

(13) Synthesis Example of 4-(4-n-Propylcyclohexyl)benzaldehyde 74.3 g (3.71 mol) of anhydrous HF and 50.5 g (0.744 mol) of BF3 were charged into a temperature-controllable autoclave (made of SUS316L) having an internal capacity of 500 mL equipped with an electromagnetic stirring device, and the content was stirred and increased in pressure with carbon monoxide to 2 MPa while maintaining the liquid temperature to −30° C. Thereafter, while maintaining the pressure to 2 MPa and the liquid temperature to −30° C., a raw material obtained by mixing 50.0 g (0.248 mol) of (trans-4-n-propylcyclohexyl)benzene (produced by Kanto Kagaku Co., Ltd., purity: 98% or more) and 50.0 g of n-heptane was fed thereto. After maintaining 1 hour, the content was collected into ice, diluted with benzene, and neutralized to provide an oily layer, which was analyzed by gas chromatograph for evaluating the reaction performance. The (trans-4-n-propylcyclohexyl)benzene conversion was 100%, and the 4-(trans-4-n-propylcyclohexyl)benzaldehyde selectivity was 95.2%. The target component was isolated by simple distillation and analyzed by GC-MS, and the result exhibited a molecular weight of 230, which was the target component, 4-(trans-4-n-propylcyclohexyl)benzaldehyde. The chemical shift values of $^1$H-NMR in deuterated chloroform solvent (δ ppm, TMS standard) were 0.9 (t, 3H), 1.0 to 1.6 (m, 9H), 1.9 (m, 4H), 2.55 (m, 1H), 7.36 (d, 2H), 7.8 (d, 2H) and 10 (s, 1H). The purity of 4-(4-n-propylcyclohexyl)benzaldehyde was 98.3%, and the purity of the trans-isomer was 99.0%.

(14) Synthesis Example of 4-Cyclohexylbenzaldehyde

The formylation reaction and the process of the reaction solution were carried out in the same manner as in the item (1) except that a mixture of 57.0 g (0.248 mol) of 4-cyclohexylbenzene and 57.0 g of n-heptane was charged as a raw material. The resulting oily layer was analyzed by gas chromatograph for evaluating the reaction performance. The 4-cyclohexylbenzene conversion was 100%, and the 4-cyclohexylbenzaldehyde selectivity was 97.3%.

Synthesis Example of Polyphenol Compound (Hereinafter Abbreviated as "CR")

(15) Synthesis Example of CR-1

Resorcinol, produced by Kanto Chemical Co., Ltd., (22 g, 0.2 mol), 4-(4-n-propylcyclohexyl)benzaldehyde synthesized in the aforementioned synthesis example (46.0 g, 0.2 mol) and dehydrated ethanol (200 mL) were charged under a nitrogen stream into a four-neck flask (1,000 L) having been sufficiently dried and substituted by nitrogen equipped with a dropping funnel, a Dimroth condenser, a thermometer and a stirring blade, thereby preparing an ethanol solution. The solution was heated with a mantle heater to 85° C. under stirring. 75 mL of concentrated hydrochloric acid (35%) was added dropwise thereto over 30 minutes through the dropping funnel, and the reaction mixture was further stirred at 85° C. for 3 hours. After completing the reaction, the reaction mixture was cooled by standing, and after reaching room temperature, it was cooled with an ice bath. After allowing to stand for 1 hour, target light yellow coarse crystals were formed and separated. The coarse crystals were rinsed twice with 500 mL of methanol, and were filtered and dried in vacuum to provide CR-1 (58 g, yield: 91%) represented by the following chemical formula. LC-MS analysis of the structure of the compound provided a molecular weight of 1,289, which was the molecular weight of the target compound. The chemical shift values of $^1$H-NMR in deuterated chloroform solvent (δ ppm, TMS standard) were 0.9 to 1.9 (m, 68H), 5.5, 5.6 (d, 4H), 6 to 6.8 (m, 24H), 8.4 and 8.5 (m, 8H).

(16) Synthesis Example of CR-2

Synthesis was carried out in the same manner as in the synthesis example of CR-1 except that 4-cyclohexylbenzaldehyde synthesized in the aforementioned synthesis example was used instead of 4-(4-n-propylcyclohexyl)benzaldehyde. As a result, the target compound, CR-2, represented by the following chemical formula (63.0 g, yield: 90%) was obtained. The structure of the compound was determined by

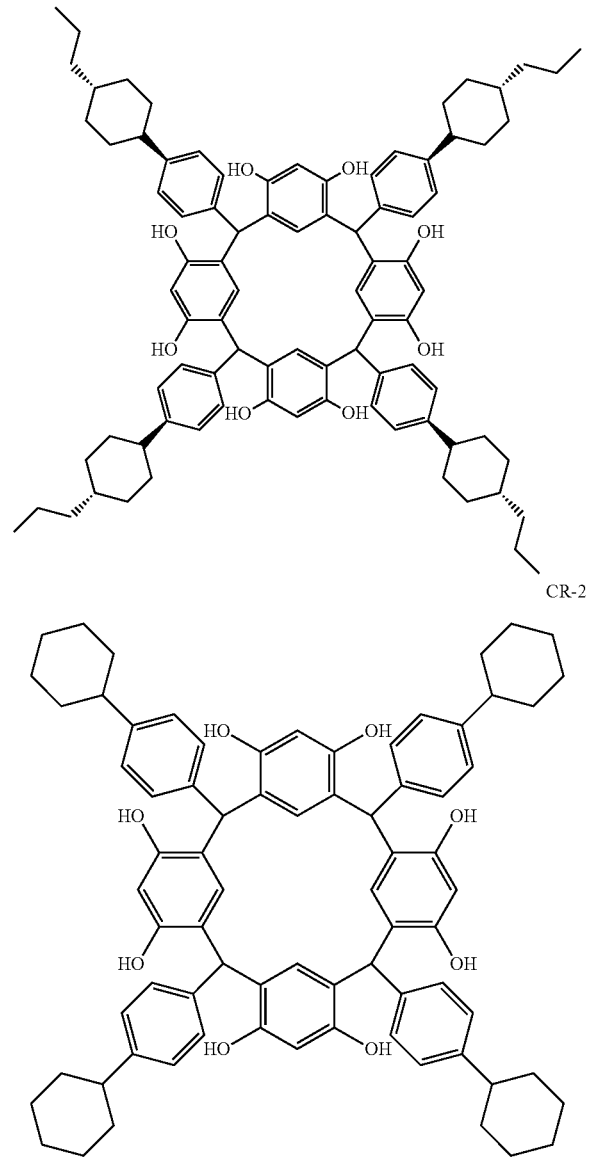

(17) Synthesis Example of CR-3

10.4 g (0.05 mol) of 9,10-phenanthrenequinone (produced by Acros Organics) and 18.8 g (0.2 mol) of phenol (produced by Kanto Kagaku Co., Ltd.) were charged into a vessel having an internal capacity of 100 mL equipped with a stirring device, a condenser and a buret, and 5 mL of β-mercaptopropionic acid and 5 mL of 95% sulfuric acid were added thereto, followed by stirring the reaction solution at 85° C. for 6 hours, thereby completing the reaction. After completing the reaction, 50 g of methanol or isopropyl alcohol was added to the reaction solution, which was then heated to 60° C., followed by continuously stirring for 1 hour. 90 g of pure water was added thereto to deposit the reaction product, which was cooled to room temperature and then separated by filtration. The resulting solid matter was filtered and dried to provide the target compound (CR-3). It was confirmed that the compound had the chemical structure represented by the following formula (CR-3) by 400 MHz-$^1$H-NMR. The glass transition temperature of the target compound (CR-3) measured was 119° C., and the compound did not have a melting point.

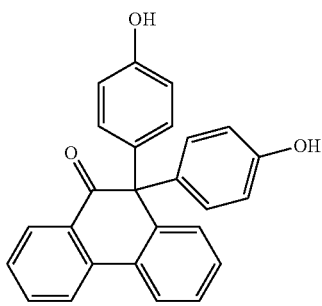

(18) Synthesis Method of CR-4 (2,7-bis(bis(2,3,5-trimethyl-4-hydroxy)methyl)naphthalene)

195 g (1.6 mol) of 2,3,6-trimethylphenol (produced by Kanto Kagaku Co., Ltd.) and 20.0 g (0.1 mol) of 2,7-naphthalenedialdehyde (which was synthesized according to JP-A-2003-155259 using dimethyl 2,7-naphthalenedicarboxylate, produced by Mitsubishi Gas Chemical Co., Inc.) were mixed and dissolved by heating to approximately 60° C. 0.2 mL of sulfuric acid (produced by Kanto Kagaku Co., Ltd.) and 1.6 mL of 3-mercaptopropionic acid (produced by Kanto Kagaku Co., Ltd.) were added thereto and reacted therewith under stirring. After confirming that the conversion reached 100% by liquid chromatography, 100 mL of toluene (produced by Kanto Kagaku Co., Ltd.) was added thereto. A solid matter having been deposited by cooling was filtered under reduced pressure to provide the target compound represented by the following chemical formula (CR-4), 2,7-bis(bis(2,3,5-trimethyl-4-hydroxy)methyl)naphthalene. The structure of the compound was confirmed by elemental analysis and $^1$H-NMR measurement (400 MHz, d-DMSO, TMS internal standard).

(19) Synthesis Method of CR-5 (2,6-bis(bis(2-isopropyl-4-hydroxy)methyl)naphthalene)

Synthesis was carried out in the same manner as in the synthesis example of CR-4 except that 2,7-naphthalenedialdehyde was changed to 2,6-naphthalenedialdehyde, and trimethylphenol was changed to thymol, thereby providing 2,6-bis(bis(2-isopropyl-4-hydroxy)methyl)naphthalene represented by the following chemical formula (CR-5).

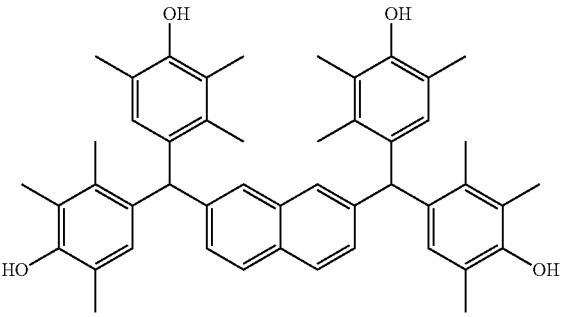

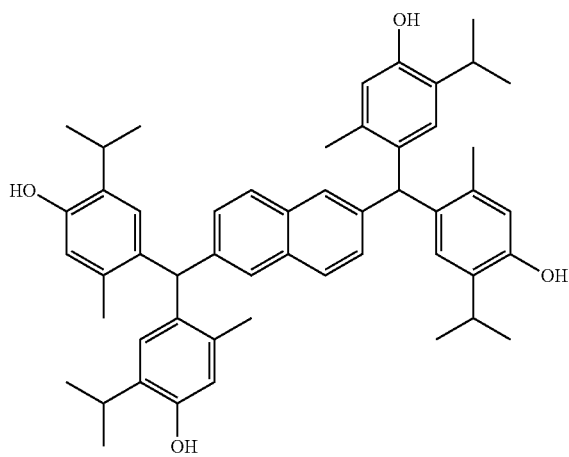

CR-5

Examples 1 to 15 and Comparative Examples 1 and 2

The compositions for forming an underlayer film having the formulations shown in Table 1 were prepared.

The solutions for forming an underlayer film each were spin-coated on a silicon substrate and baked at from 250 to 300° C. for 90 seconds to provide an underlayer film having a thickness of 200 nm. Measurement at 193 nm was carried out with an incident angle variable spectral ellipsometer (VASE) of J.A. Woollam Co., Inc., and the absorption was fitted by approximating by Gaussian oscillator according to the general oscillator model, thereby providing the complex refractive index of the underlayer film. The refractive index n and the extinction coefficient k are shown in Table 1. The etching test was carried out under the following conditions. The results are shown in Table 1.

Conditions for Etching Test

Etching device: RIE-IONR, produced by Samco International, Inc.

Output: 50 W

Pressure: 20 Pa

Time: 2 min

Etching Gas:

(a) $CF_4$ gas flow rate: 10 (sccm)

(b) Ar gas flow rate/$CF_4$ gas flow rate/$O_2$ gas flow rate=50/5/5 (sccm)

TABLE 1

|  | Resin compound (part by mass) | Crosslinking agent*[1] (part by mass) | Acid generating agent*[2] (part by mass) | Organic solvent*[3] (part by mass) | Complex refractive index (193 nm) n k | Etching rate (nm/min) |
|---|---|---|---|---|---|---|
| Example 1 | NF-1 (10) | — | — | PGMEA (90) | 1.35 0.30 | (a) 16.5 (b) 96.9 |
| Example 2 | NF-2 (10) | — | — | CHN (90) | 1.39 0.25 | (a) 16.1 (b) 91.4 |
| Example 3 | NF-3 (10) | — | — | CHN (90) | 1.42 0.23 | (a) 16.3 (b) 94.4 |
| Example 4 | NF-4 (10) | — | — | CHN (90) | 1.43 0.18 | (a) 16.5 (b) 93.9 |
| Example 5 | NF-5 (10) | — | — | CHN (90) | 1.42 0.23 | (a) 14.5 (b) 90.1 |
| Example 6 | NF-6 (10) | — | — | CHN (90) | 1.43 0.24 | (a) 15.6 (b) 92.4 |
| Example 7 | NF-7 (10) | — | — | CHN (90) | 1.42 0.26 | (a) — (b) — |
| Example 8 | NF-8 (10) | — | — | CHN (90) | 1.50 0.21 | (a) — (b) — |
| Example 9 | NF-9 (10) | — | — | CHN (90) | 1.38 0.23 | (a) 14.1 (b) 89.1 |
| Example 10 | NF-10 (10) | — | — | CHN (90) | 1.36 0.28 | (a) 14.5 (b) 88.1 |
| Example 11 | NF-1 (10) | NIKALAC (0.5) | DTDPI (0.1) | PGMEA (90) | 1.38 0.30 | (a) — (b) — |
| Example 12 | NF-2 (10) | NIKALAC (0.5) | DTDPI (0.1) | CHN (90) | 1.38 0.28 | (a) — (b) — |
| Example 13 | NF-1 (5) NF-4 (5) | — | — | CHN (90) | 1.43 0.26 | (a) 15.1 (b) 90.2 |
| Example 14 | 1.5-DMN-R (7.5) CR-1 (2.5) | — | DTDPI (0.05) | CHN (90) | 1.40 0.33 | (a) 16.2 (b) 108 |
| Example 15 | 1.5-DMN-R (5) CR-1 (5) | — | DTDPI (0.05) | CHN (90) | 1.43 0.35 | (a) 18.5 (b) 110 |
| Example 16 | 1.5-DMN-R (7.5) CR-2 (2.5) | — | DTDPI (0.05) | CHN (90) | 1.39 0.30 | (a) 15.3 (b) 106 |
| Example 17 | 1.5-DMN-R (5) CR-3 (5) | — | DTDPI (0.05) | CHN (90) | 1.39 0.39 | (a) 14.3 (b) 98 |
| Example 18 | 1.5-DMN-R (5) CR-4 (5) | — | DTDPI (0.05) | CHN (90) | 1.37 0.37 | (a) 14.3 (b) 92 |
| Example 19 | 1.5-DMN-R (5) CR-5 (5) | — | DTDPI (0.05) | CHN (90) | 1.39 0.4 | (a) 15.3 (b) 96 |
| Example 20 | NF-1 (7.5) SN-CN (2.5) | — | — | — | 1.40 0.48 | (a) 15.0 (b) 92 |

TABLE 1-continued

| | Resin compound (part by mass) | Crosslinking agent*1 (part by mass) | Acid generating agent*2 (part by mass) | Organic solvent*3 (part by mass) | Complex refractive index (193 nm) n k | Etching rate (nm/min) |
|---|---|---|---|---|---|---|
| Example 21 | NF-2 (7.5) SN-CN (2.5)*4 | — | — | — | 1.40 0.42 | (a) 17.0 (b) 95 |
| Comparative Example 1 | PHS (10)*5 | — | — | PGMEA (90) | 1.59 1.03 | (a) 18.7 (b) 116 |
| Comparative Example 2 | novolak (10)*6 | — | — | PGMEA (90) | 1.19 0.80 | (a) 17.2 (b) 111 |

*1crosslinking agent: "NIKALAC MX270", produced by Sanwa Chemical Co., Ltd.
*2acid generating agent: di-tert-butyldiphenyliodonium nonafluoromethanesulfonate (DRDPI), produced by Midori Kagaku Co., Ltd.
*3organic solvent: propylene glycol monomethyl ether acetate (PGMEA), cyclohexanone (CHN)
*4cyanate resin, produced by Mitsubishi Gas Chemical Co., Ltd. (see the following chemical formula)
*5PHS: polyhydroxystyrene, produced by Sigma-Aldrich Corporation
*6novolak: PSM4357, produced by Gunei Chemical Industry Co., Ltd.

The underlayer films of the examples had a high refractive index (n) and a low extinction coefficient (k) and thus exhibited excellent optical characteristics and excellent etching resistance. Comparative Examples 1 and 2, in which the composition for forming an underlayer of the present invention was not used, exhibited a high extinction coefficient (k) and thus failed to exhibit sufficient capability in optical characteristics.

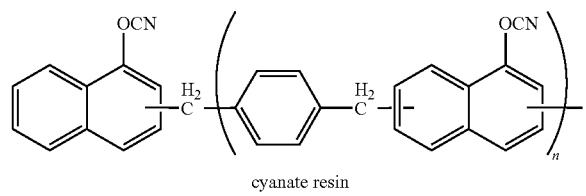

cyanate resin

In the formula, n represents an integer of from 1 to 4.

Example 22

The solution of the material for forming an underlayer film (Example 6) was coated on an $SiO_2$ substrate having a thickness of 300 nm and baked at 300° C. for 120 seconds to form an underlayer film having a thickness of 80 nm. An ArF resist solution was coated thereon and baked at 130° C. for 60 seconds to form a photoresist layer having a thickness of 150 nm. The ArF resist solution was prepared by mixing 5 parts of the compound represented by the following formula (110), 1 part of triphenylsulfonium nonafluoromethanesulfonate, 2 parts of tributylamine and 92 parts of PGMEA.

Subsequently, the assembly was exposed with an electron beam patterning device (ELS-7500, produced by Elionix Co., Ltd., 50 keV), baked at 115° C. for 90 seconds (PEB), and developed with a 2.83% by mass tetramethylammonium hydroxide (TMAH) aqueous solution for 60 seconds, thereby providing a positive pattern. The results of observation of the resulting pattern of 60 nm L/S (1/1) are shown in Table 2.

Comparative Example 3

The same procedures as in Example 22 were carried out except that the underlayer film was not formed, and evaluated in the same manner. The results of evaluation are shown in Table 2.

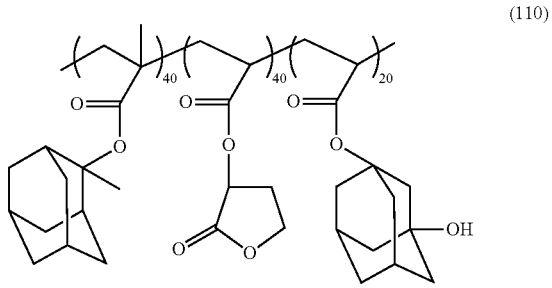

(110)

In the formula (110), the numerals 40, 40 and 20 each show the proportions of the constitutional units but do not mean a block copolymer.

TABLE 2

| | Material for forming underlayer film | Resolution | Sensitivity |
|---|---|---|---|
| Example 22 | Example 6 | 60 nm L&S | 12 µC/cm² |
| Comparative Example 3 | none | 80 nm L&S | 26 µC/cm² |

The resist patterns of Example 22 and Comparative Example 3 obtained by electron beam exposure and development each were transferred to the underlayer film under the following conditions. The etching conditions were as follows. The cross sectional shapes of the patterns were observed and compared to each other with an electron microscope (S-4800, produced by Hitachi, Ltd.)

Conditions for Production of Resist Pattern
Electron beam patterning device: ELS-7500, produced by Elionix Co., Ltd.
Acceleration voltage: 50 keV
Pre-baking temperature: 115° C.
Post-baking temperature: 125° C.
Developing liquid: 2.38% TMAH aqueous solution
Developing time: 60 seconds
Rinsing time: 60 seconds
Conditions for Dry Etching Transfer
Etching device: RIE-IONR, produced by Samco International, Inc.
Output: 50 W
Pressure: 20 Pa
Time: 2 min
Etching gas: Ar gas flow rate/$CF_4$ gas flow rate/$O_2$ gas flow rate=50/5/5 (sccm)

Example 22 was favorable in all the shape of the resist after developing and the shape of the underlayer film after the oxygen etching and after the substrate etching process in the multi-layer resist process, and it was found that the shape thereof after developing and after the substrate etching process in the case of using as a single layer resist hard mask was good.

The invention claimed is:

1. A composition, comprising:
a naphthalene formaldehyde polymer obtained by reacting at least one of a naphthalene and an alkylnaphthalene with formaldehyde; and
an organic solvent;
wherein the naphthalene formaldehyde polymer comprises a constitutional unit of formula (2):

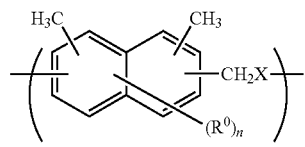
(2)

wherein
$R^0$ are each independently a hydrogen atom, a methoxymethyl group or a hydroxymethyl group,
X is —$(OCH_2)_t$—, wherein t is an integer of from 0 to 2;
n is an integer of from 0 to 6.

2. The composition according to claim 1, wherein the naphthalene formaldehyde polymer further comprises a constitutional unit of formula (3):

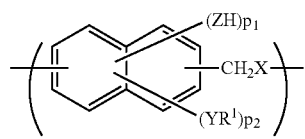
(3)

wherein
$R^1$ are each independently a hydrogen atom or at least one functional group selected from the group consisting of norbornane, cyclohexane, tricyclodecane, adamantane, decalin, bicyclooctyl and acenaphthene,
Y are each independently —CO— or a single bond;
Z are each independently an oxygen atom or a sulfur atom, and
p1 and p2 are each integers such $1 \leq p1 \leq 2$ and $0 \leq p2 \leq 4$.

3. The composition according to claim 1, wherein the naphthalene formaldehyde polymer further comprises a constitutional unit of formula (4):

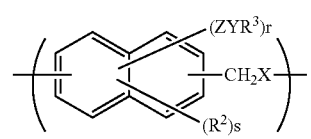
(4)

wherein
$R^2$ are each independently a hydrogen atom, a hydroxyl group or a hydrocarbon group having from 1 to 10 carbon atoms;
$R^3$ are each independently at least one functional group selected from the group consisting of norbornane, cyclohexane, tricyclodecane, adamantane, decalin and bicyclooctyl,
r and s are each integers such that $1 \leq r \leq 2$ and $0 \leq s \leq 4$.

4. The composition according to claim 1, wherein the naphthalene formaldehyde polymer further comprises a constitutional unit of formula (10):

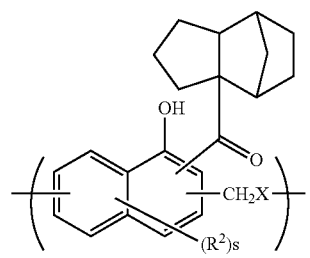
(10)

wherein
$R^2$ are each independently a hydrogen atom, a hydroxyl group or a hydrocarbon group having from 1 to 10 carbon atoms, and
S is an integer such that $0 \leq s \leq 4$.

5. The composition according to claim 4, wherein the constitutional unit formula (10) is a constitutional unit of formula (11):

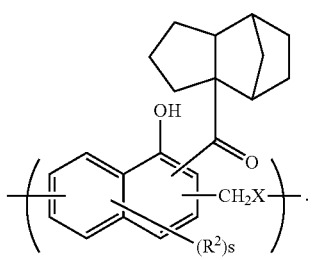
(11)

6. The composition according to claim 2, wherein the naphthalene formaldehyde polymer is a modified dimethylnaphthalene formaldehyde resin comprising a constitutional unit of formula (9):

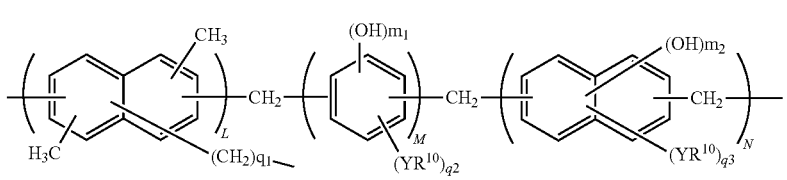
(9)

wherein
R10 are each independently at least one functional group selected from the group consisting of norbornane, cyclohexane, tricyclodecane, adamantane, decalin, bicyclooctyl and acenaphthene, L, M and N constitutional molar percentage values of the dimethylnaphthalene formaldehyde resin, the phenol compound and the naphthol compound, respectively, based on a total amount of the constitutional units, and are values such that L is from 20 to 80, M is from 0 to 80 and N is from 0 to 80, with the proviso that that M and N are not simultaneously zero;

m1 and m2 are each an integer of from 1 to 3;
q1 is an integer of from 0 to 4;
q2 is an integer of from 1 to 2; and
q3 is an integer of from 1 to 5.

7. The composition according to claim 2, wherein the naphthalene formaldehyde polymer is a modified dimethylnaphthalene formaldehyde resin comprising a constitutional mitt of formula (12):

wherein
$R^4$ is a monovalent to tetravalent substituent having from 10 to 18 carbon atoms comprising at least one structure selected from the group consisting of a naphthalene structure, a phenanthrene structure, a pyrene structure, a fluorene structure, an acenaphthene structure, a 1-ketoacenaphthene structure, a benzophenone structure, a xanthene structure, a thioxanthene structure, a norbornane structure, a cyclohexane structure, a tricyclodecane structure, an adamantane structure, a bicyclooctyl structure and nuclear hydrogenated structures of these structures;

$R^6$ are each independently a substituent selected from the group consisting of a halogen atom, an alkyl group having from 1 to 6 carbon atoms, an alkoxy group, norbornane, cyclohexane, tricyclodecane, adamantane, decalin and a bicyclooctyl group;

l is an integer of from 1 to 4;
u1 is an integer of from 0 to 4;
u2 is an integer of from 1 to 4,

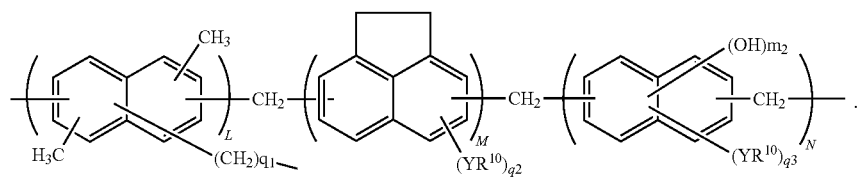

(12)

8. The composition according to claim 1, wherein the composition further comprises at least one polyphenol compound of formula (6):

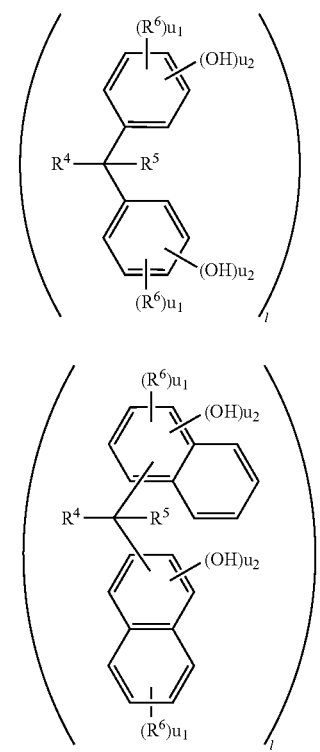

(6)

with the proviso that $1 \leq u1+u2 \leq 5$; and
$R^5$ are each independently a substituent selected from the group consisting of a hydrogen atom and an alkyl group having from 1 to 6 carbon atoms, optionally bonded to $R^4$ via a single bond.

9. The composition according to claim 1, wherein the composition further comprises a cyclic organic compound of formula (7):

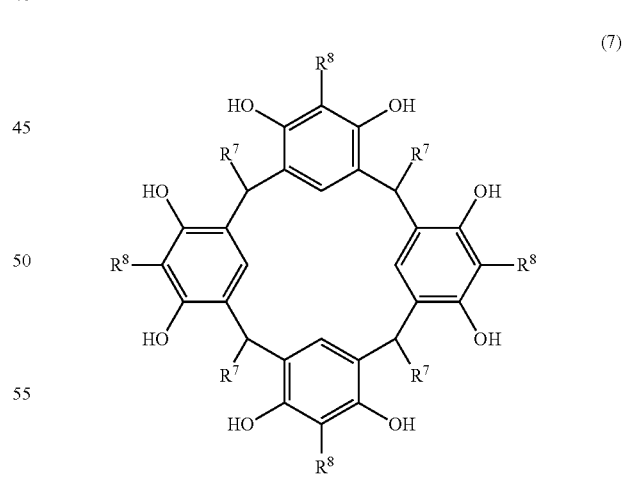

(7)

wherein
$R^7$ are each independently an alkyl group having from 1 to 20 carbon atoms, an aryl group having from 6 to 24 carbon atoms, an allyl group, a hydroxyalkyl group, a cyanoalkyl group, a halogenoalkyl group, a hydroxyaryl group, a cyanoaryl group or a halogenoaryl group; and
$R^8$ are each independently a hydrogen atom or a hydroxyl group.

10. The composition according to claim 1, wherein the composition further comprises a cyclic organic compound of formula (8):

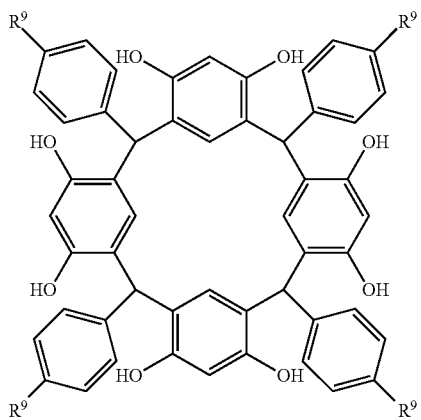

wherein
R$^9$ are each independently a substituent selected from the group consisting of a hydrogen atom, an alkyl group having from 1 to 6 carbon atoms, an alkoxy group, norbornane, cyclohexane, tricyclodecane, adamantane, decalin and a bicyclooctyl group.

11. The composition according to claim 1, wherein the composition further comprises at least one cyanate compound of formulae (13) and (14):

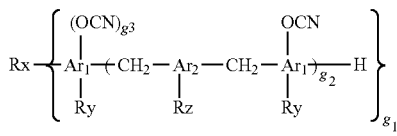

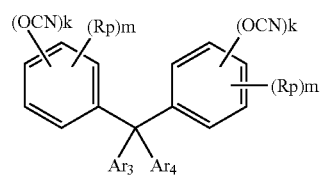

wherein
Rx are each independently a group selected from the group consisting of an aryl group, a hydrocarbon group having from 1 to 4 carbon atoms, a hydrogen atom and a single bond;
Ry and Rp are each independently a hydrogen atom, an alkyl group or an aryl group;
Rz are each independently a hydrogen atom, an alkyl group or an aryl group, Ar$_2$, Ar$_3$ and Ar$_4$ are each independently a phenylene group, a naphthylene group or a biphenylene group, with the proviso that when Ar$_2$ is a phenylene group, Ar$_1$ is a naphthylene group or a biphenylene group, and when Ar$_2$ is a naphthylene group or a biphenylene group, Ar$_1$ is a phenylene group, a naphthylene group or a biphenylene group, and
Ar$_3$ and Ar$_4$ are optionally bonded to each other through a single bond or directly by the aromatic rings;
g$_1$ is an integer of from 1 to 5;
g$_2$ is an integer of from 0 to 50;
g$_3$ is an integer of from 1 to 3;
k is an integer of from 1 to 5; and
m is an integer of from 0 to 4,
with the proviso that 1≤k+m≤5.

12. The composition according to claim 1, wherein the composition further comprises a cyanate compound of formula (15):

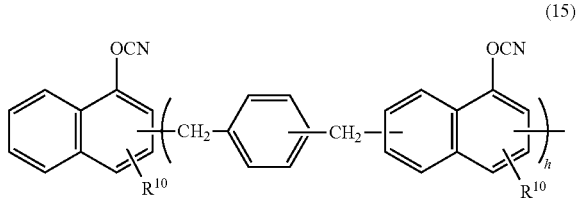

wherein
R$^{10}$ and R$^{11}$ are each independently a hydrogen atom or an alkyl group, and h is an integer of from 1 to 50.

13. The composition according to claim 1, wherein the composition further comprises an acid generating agent.

14. The composition according to claim 1, wherein the composition further comprises a crosslinking agent.

15. An underlayer film for lithography obtained by a method comprising applying the composition according to claim 1 to a substrate.

16. A method for forming a multi-layer resist pattern, comprising: forming the underlayer film according to claim 15 on a substrate; forming at least one photoresist layer on the underlayer film; irradiating a prescribed area of the photoresist layer with a radiation ray; developing the photoresist layer with an alkali to form a resist pattern; and etching the underlayer film with plasma containing at least oxygen gas with the resist pattern as a mask, thereby transferring the resist pattern to the underlayer film.

17. A single layer resist coating comprising an antireflection film obtained by applying the composition according to claim 1 with the resist coating.

18. A method for forming an underlayer film for lithography, comprising:
applying a composition comprising a naphthalene formaldehyde polymer obtained by reacting at least one of a naphthalene and an alkylnaphthalene with formaldehyde: and an organic solvent, to a substrate to form an underlayer film; and then
applying a resist layer to the underlayer film;
wherein
the naphthalene formaldehyde polymer comprises a constitutional unit of formula (1):

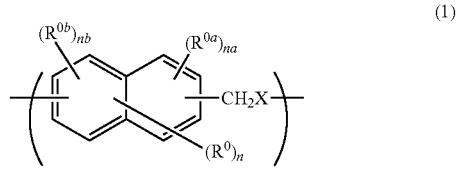

wherein
R$^0$ are each independently a hydrogen atom, a methoxymethyl group or a hydroxymethyl group,
R$^{0a}$ and R$^{0b}$ are each independently a hydrogen atom or an alkyl group having from 1 to 3 carbon atoms, X is —(OCH$_2$)$_t$—, wherein t is an integer of from 0 to 2;
n is an integer of from 0 to 6; and
na and nb are each independently an integer of from 0 to 3, with the proviso that 0≤n+na+nb≤6.

* * * * *